United States Patent
Nishimura et al.

(10) Patent No.: US 9,916,962 B2
(45) Date of Patent: Mar. 13, 2018

(54) MULTI CHARGED PARTICLE BEAM IRRADIATION APPARATUS, MULTI CHARGED PARTICLE BEAM IRRADIATION METHOD, AND MULTI CHARGED PARTICLE BEAM ADJUSTMENT METHOD

(71) Applicant: NuFlare Technology, Inc., Yokohama-shi (JP)

(72) Inventors: Shinsuke Nishimura, Yokohama (JP); Munehiro Ogasawara, Hiratsuka (JP); Takanao Touya, Kawasaki (JP); Hirofumi Morita, Setagaya-ku (JP)

(73) Assignee: NuFlare Technology, Inc., Yokohama-shi (JP)

( * ) Notice: Subject to any disclaimer, the term of this patent is extended or adjusted under 35 U.S.C. 154(b) by 0 days.

(21) Appl. No.: 15/466,333

(22) Filed: Mar. 22, 2017

(65) Prior Publication Data

US 2017/0309440 A1 Oct. 26, 2017

(30) Foreign Application Priority Data

Apr. 26, 2016 (JP) ................................ 2016-088431

(51) Int. Cl.
*H01J 37/153* (2006.01)
*H01J 37/141* (2006.01)
(Continued)

(52) U.S. Cl.
CPC .......... *H01J 37/153* (2013.01); *H01J 37/045* (2013.01); *H01J 37/141* (2013.01);
(Continued)

(58) Field of Classification Search
CPC ........ H01J 37/04; H01J 37/045; H01J 37/141; H01J 37/1472; H01J 37/153; H01J 37/3177; H01J 37/3171; H01J 37/3174
See application file for complete search history.

(56) References Cited

U.S. PATENT DOCUMENTS

| 2005/0201246 A1* | 9/2005 | Buschbeck | ............ B82Y 10/00 369/101 |
| 2012/0295203 A1* | 11/2012 | Sano | .................... H01J 37/3007 430/296 |

(Continued)

FOREIGN PATENT DOCUMENTS

JP 2015-23286 2/2015

*Primary Examiner* — David E Smith
(74) *Attorney, Agent, or Firm* — Oblon, McClelland, Maier & Neustadt, L.L.P.

(57) ABSTRACT

A multi charged particle beam irradiation apparatus includes a shaping aperture array substrate, where plural openings are formed as an aperture array, to shape multi-beams by making a region including entire plural openings irradiated by a charged particle beam, and making portions of a charged particle beam individually pass through a corresponding one of the plural openings; and a plurality of stages of lenses, arranged such that a reduction ratio of multi-beams by at least one lens of a stage before the last stage lens is larger than that of the multi-beams by the last stage lens, to correct distortion of a formed image obtained by forming an image of the aperture array by the multi-beams, and to form the image of the aperture array by the multi-beams at a height position between the last stage lens and a last-but-one stage lens, and at the surface of a target object.

10 Claims, 14 Drawing Sheets

(51) Int. Cl.
*H01J 37/317* (2006.01)
*H01J 37/04* (2006.01)
*H01J 37/147* (2006.01)

(52) U.S. Cl.
CPC ...... *H01J 37/1472* (2013.01); *H01J 37/3177* (2013.01); *H01J 2237/0437* (2013.01)

(56) References Cited

U.S. PATENT DOCUMENTS

2013/0082187 A1* 4/2013 Ogasawara ......... H01J 37/3007 250/396 ML
2015/0021493 A1* 1/2015 Platzgummer ........ H01J 37/045 250/396 R

* cited by examiner

MULTI CHARGED PARTICLE BEAM IRRADIATION APPARATUS, MULTI CHARGED PARTICLE BEAM IRRADIATION METHOD, AND MULTI CHARGED PARTICLE BEAM ADJUSTMENT METHOD

CROSS-REFERENCE TO RELATED APPLICATION

This application is based upon and claims the benefit of priority from the prior Japanese Patent Application No. 2016-088431 filed on Apr. 26, 2016 in Japan, the entire contents of which are incorporated herein by reference.

BACKGROUND OF THE INVENTION

Field of the Invention

Embodiments of the present invention relate generally to a multi charged particle beam irradiation apparatus, a multi charged particle beam irradiation method, and a multi charged particle beam adjustment method, and more specifically, relate to an adjustment method of a reduction optical system and an imaging (image formation) optical system in multi-beam writing, for example.

Description of Related Art

The lithography technique that advances miniaturization of semiconductor devices is extremely important as a unique process whereby patterns are formed in semiconductor manufacturing. In recent years, with high integration of LSI, the line width (critical dimension) required for semiconductor device circuits becomes progressively narrower year by year. The electron beam writing technique, which intrinsically has excellent resolution, is used for writing or "drawing" with electron beams on a wafer, etc.

As a known example of employing the electron beam writing technique, there is a writing apparatus using multibeams. Since it is possible for multi-beam writing to irradiate multiple beams at a time, the writing throughput can be greatly increased in comparison with single beam writing. For example, a writing apparatus employing the multi-beam technique forms multi-beams by letting portions of an electron beam emitted from an electron gun pass through a corresponding hole of a plurality of holes in a mask, performs blanking control for each beam, reduces each unblocked beam by an optical system, and deflects the beam by a deflector to irradiate a desired position on a target object or "sample".

In multi-beam writing, a large number of beams are needed in order to increase the throughput. However, there is a limit in pitch reduction between beams in mechanism for forming multi-beams and/or providing blanking control. Therefore, if the number of beams increases, the size of the image of the entire multi-beams becomes large in accordance with the increase of the beams. Thus, when irradiating a target object, the electron optical system of high reduction ratio is needed. If there is no restriction on the height dimension of the electron beam column of the writing apparatus, it is not so difficult to increase the reduction ratio. However, since there is a limitation in the space to arrange the writing apparatus, restriction occurs in the height dimension of the electron beam column. Then, conventionally, there has been proposed a writing apparatus in which two-stage objective lenses of the same reduction ratio are arranged so as to increase the final total reduction ratio (e.g., refer to Japanese Patent Application Laid-open No. 2015-023286). However, if the reduction ratio is increased, a problem occurs in that distortion in a formed (focused) image of an aperture image obtained by forming multi-beams on the target object becomes large.

BRIEF SUMMARY OF THE INVENTION

According to one aspect of the present invention, a multi charged particle beam irradiation apparatus includes an emission unit configured to emit a charged particle beam; a shaping aperture array substrate, in which a plurality of first openings are formed as an aperture array, configured to form and shape multi-beams by making a region including a whole of the plurality of first openings irradiated by the charged particle beam, and making portions of the charged particle beam individually pass through a corresponding one of the plurality of first openings; and a plurality of stages of lenses, arranged such that a reduction ratio of multi-beams by at least one lens of a stage before a last stage lens of the plurality of stages of lenses is larger than a reduction ratio of the multi-beams by the last stage lens, configured to correct a distortion of a formed image in a case of forming an image of the aperture array by the multi-beams, and to form the image of the aperture array by the multi-beams at a height position between the last stage lens and a last-but-one stage lens of the plurality of stages of lenses, and at a surface of a target object.

According to another aspect of the present invention, a multi charged particle beam irradiation method includes emitting a charged particle beam; forming and shaping multi-beams by making portions of the charged particle beam individually pass through a corresponding one of a plurality of openings as an aperture array in a shaping aperture array substrate; and correcting a distortion of a formed image in a case of forming an image of the aperture array by the multi-beams, and forming the image of the aperture array by the multi-beams at a height position between a last stage lens and a last-but-one stage lens of a plurality of stages of lenses, and at a surface of a target object, by using the plurality of stages of lenses arranged such that a reduction ratio of the multi-beams by at least one lens of a stage before the last stage lens is larger than a reduction ratio of the multi-beams by the last stage lens.

According to yet another aspect of the present invention, a multi charged particle beam adjustment method includes setting a set value of each stage lens for exciting a plurality of stages of lenses which form an image of an aperture array by multi-beams formed by the aperture array while reducing the multi-beams of a charge particle beam toward a target object; measuring a total reduction ratio of the multi-beams by using the plurality of stages of lenses for each of which a corresponding set value has been set; adjusting the total reduction ratio of the multi-beams to be within a first desired range by using a third and subsequent stage lenses of the plurality of stages of lenses, in a case where the total reduction ratio is not within the first desired range; measuring a distortion amount of a formed image obtained by forming the image of the aperture array by the multi-beams in a case where the total reduction ratio is within the first desired range; and adjusting the distortion amount of the formed image in the case of forming the image of the aperture array by the multi-beams to be within a second desired range by using a first stage lens and a second stage lens of the plurality of stages of lenses, in a case where the distortion amount of the formed image obtained by forming the image of the aperture array by the multi-beams is not within the second desired range, wherein in a case where the total reduction ratio is adjusted, the distortion amount of the formed image obtained by forming the image of the aperture array by the multi-beams is re-measured at each time of the adjusting, and in a case where the distortion amount of the formed image obtained by forming the image of the aperture array by the multi-beams is adjusted, the total reduction ratio of the multi-beams is re-measured at each time of the adjusting, until finally the total reduction ratio of the multi-beams comes within the first desired range, and the distortion amount of the formed image obtained by forming the image of the aperture array by the multi-beams comes within the second desired range.

DETAILED DESCRIPTION OF THE INVENTION

First Embodiment

A first embodiment describes an irradiation apparatus and method that can increase the reduction ratio of multi-beams while inhibiting distortion of an image of an aperture array obtained by forming multi-beams.

In the first embodiment, there will be described a configuration in which an electron beam is used as an example of a charged particle beam. The charged particle beam is not limited to the electron beam, and other charged particle beam such as an ion beam may also be used. Moreover, in the embodiment, the configuration using a writing apparatus as an example of an irradiation apparatus will be described. However, the irradiation apparatus is not limited to the writing apparatus, and may be an apparatus, such as an inspection apparatus, which irradiates a target object with charged particle beams.

Figure 1:
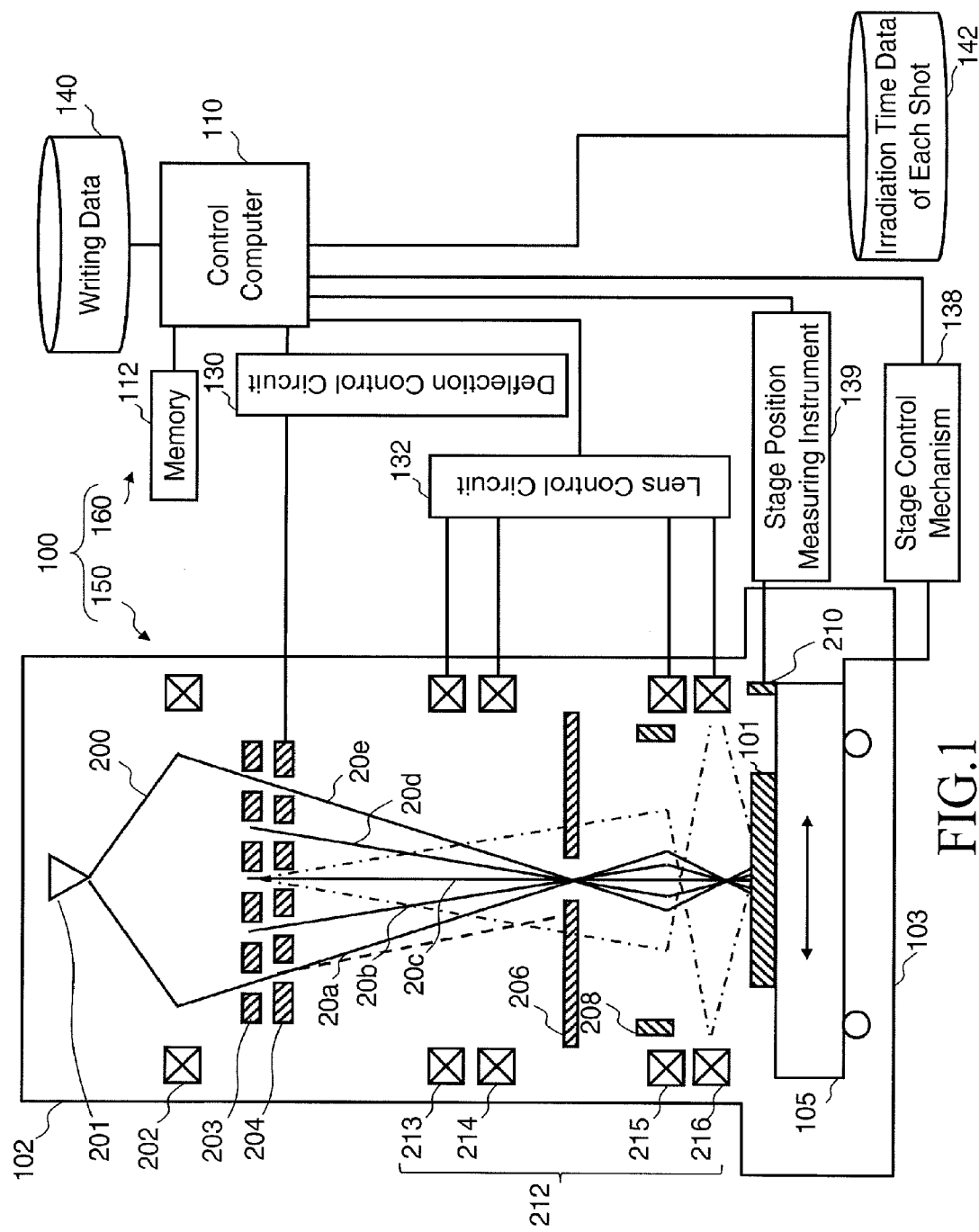
FIG. 1 is a conceptual diagram showing a configuration of a writing apparatus according to a first embodiment.

FIG. 1 is a conceptual diagram showing a configuration of a writing or "drawing" apparatus according to the first embodiment. As shown in FIG. 1, a writing apparatus 100 includes a writing unit 150 and a control unit 160. The writing apparatus 100 is an example of a multi charged particle beam writing apparatus and an example of a multi charged particle beam irradiation apparatus. The writing unit 150 includes an electron optical column 102 and a writing chamber 103. In the electron optical column 102, there are arranged an electron gun 201, an illumination lens 202, a shaping aperture array substrate 203, a blanking aperture array mechanism 204, a limiting aperture substrate 206, an electromagnetic lens group 212, and a deflector 208. In the writing chamber 103, an XY stage 105 is arranged. On the XY stage 105, a target object or "sample" 101 such as a mask serving as a writing substrate is placed when writing (irradiating) is performed. The target object 101 is, for example, an exposure mask used for manufacturing semiconductor devices, or a semiconductor substrate (silicon wafer) for manufacturing semiconductor devices. Moreover, the target object 101 may be, for example, a mask blank on which resist has been applied and nothing has yet been written. A mirror 210 for measuring the position of the XY stage 105 is arranged on the XY stage 105.

The electromagnetic lens group 212 includes multistage electromagnetic lenses 213, 214, 215, and 216 (an example of a plurality of stages of lenses, or a multistage lens). The case of FIG. 1 includes four stage electromagnetic lenses 213, 214, 215, and 216, for example.

The control unit 160 includes a control computer 110, a memory 112, a deflection control circuit 130, a lens control circuit 132, a stage control mechanism 138, a stage position measuring instrument 139, and storage devices 140 and 142 such as magnetic disk drives. The control computer 110, the memory 112, the deflection control circuit 130, the lens control circuit 132, the stage control mechanism 138, the stage position measuring instrument 139, and the storage devices 140 and 142 are connected with each other through a bus (not shown). Writing data is input from the outside of the writing apparatus 100 to the storage device 140 (storage unit), and stored therein. The multistage electromagnetic lenses 213, 214, 215, and 216 are connected to the lens control circuit 132. The illumination lens 202 (electromagnetic lens) is also connected to the lens control circuit 132. The blanking aperture array mechanism 204 is connected to the deflection control circuit 130. Moreover, the deflector 208 is also connected to the deflection control circuit 130 through a DAC amplifier unit (not shown). The stage position measuring instrument 139 irradiates the mirror 210 on the XY stage 105 with a laser beam, and receives a catoptric light from the mirror 210. Then, the stage position measuring instrument 139 measures the position of the XY stage 105 by using information of the catoptric light.

FIG. 1 shows configuration elements necessary for describing the first embodiment. It should be understood that other configuration elements generally necessary for the writing apparatus 100 may also be included therein.

Figure 2:
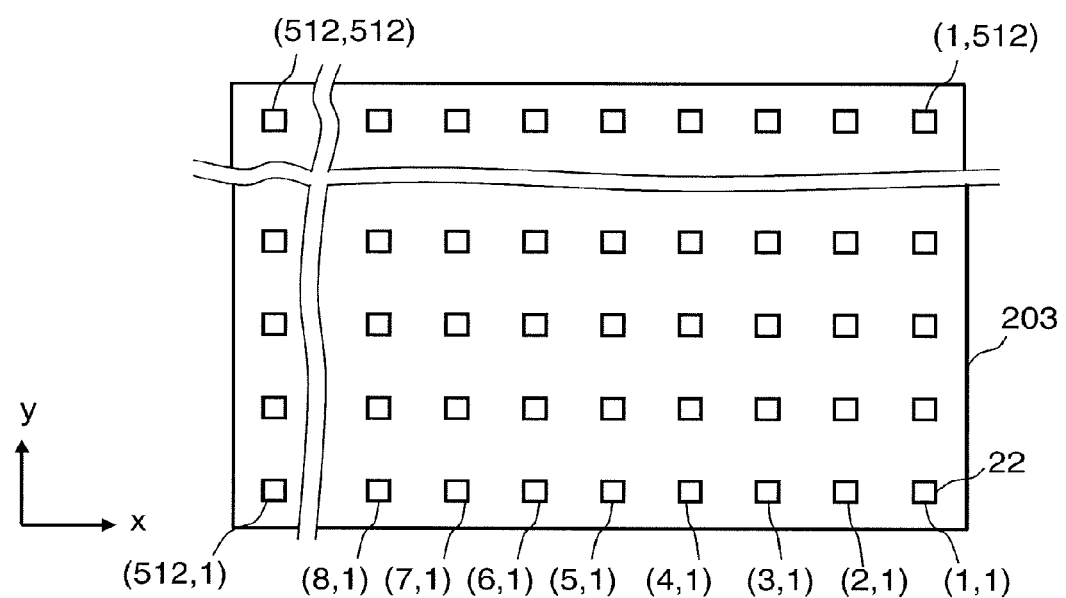
FIG. 2 is a conceptual diagram showing a configuration of a shaping aperture array substrate according to the first embodiment.

FIG. 2 is a conceptual diagram showing a configuration of a shaping aperture array substrate according to the first embodiment. As shown in FIG. 2, holes (openings) 22 of p rows long (y direction) and q columns wide (x direction) (p≥2, q≥2) are formed as an aperture array, like a matrix, at a predetermined arrangement pitch in the shaping aperture array substrate 203. In FIG. 2, for example, holes 22 of 512 (rows arrayed in the y direction)×512 (columns arrayed in the x direction) are formed. Each of the holes 22 is a quadrangle of the same dimensional shape. Alternatively, each of the holes 22 can be a circle of the same circumference. Multi-beams 20 are formed by letting portions of an electron beam 200 individually pass through a corresponding hole of a plurality of holes 22. Here, the case in which the holes 22 of two or more rows and columns are arranged in both the x and y directions is shown, but the arrangement is not limited thereto. For example, it is also acceptable that a plurality of holes 22 are arranged in only one row (x direction) or in only one column (y direction). That is, in the case of only one row, a plurality of holes 22 are arranged as a plurality of columns, and in the case of only one column, a plurality of holes 22 are arranged as a plurality of rows. The method of arranging the holes 22 is not limited to the case of FIG. 2 where holes are arranged like a grid in the length and width directions. For example, with respect to the k-th and the (k+1)th rows arrayed in the length direction (y direction), each hole in the k-th row and each hole in the (k+1) th row may be mutually displaced in the width direction (x direction) by a dimension "a". Similarly, with respect to the (k+1)th and the (k+2)th rows arrayed in the length direction (y direction), each hole in the (k+1)th row and each hole in the (k+2)th row may be mutually displaced in the width direction (x direction) by a dimension "b", for example.

Figure 3:
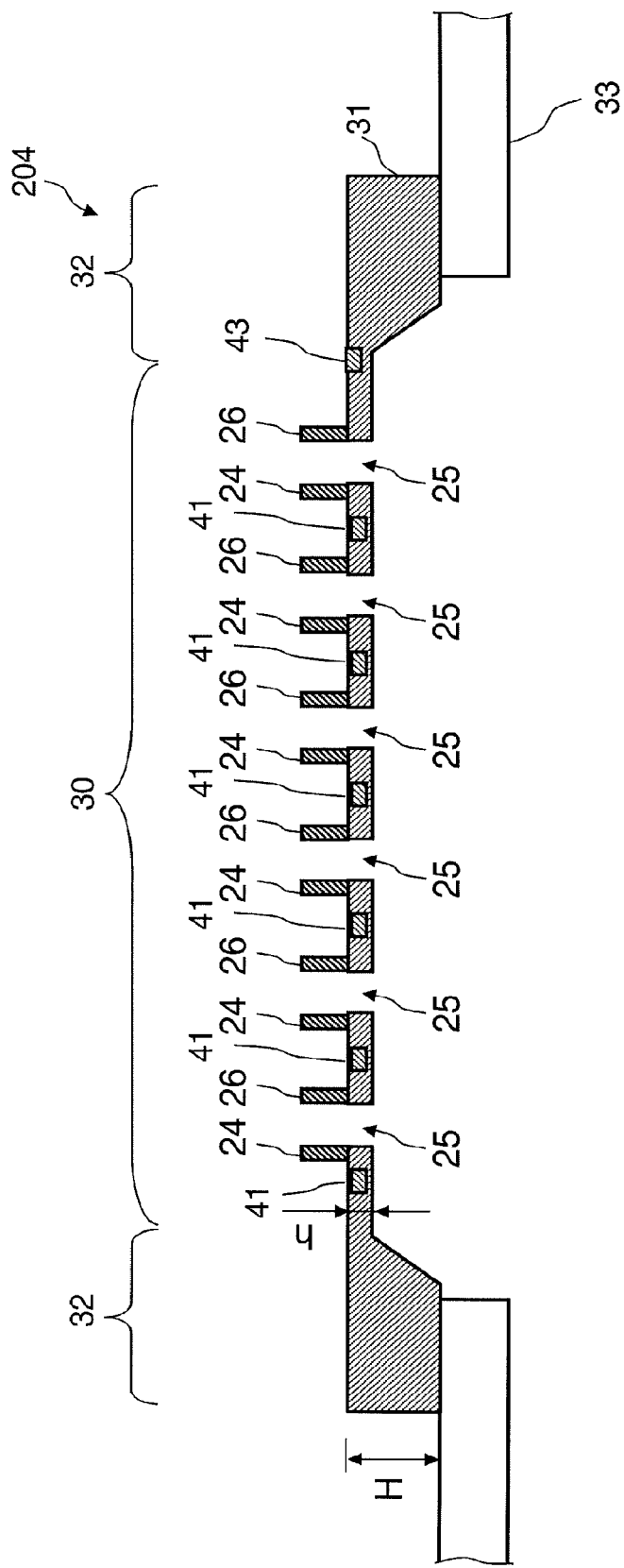
FIG. 3 is a sectional view showing a configuration of a blanking aperture array mechanism according to the first embodiment.
Figure 4:
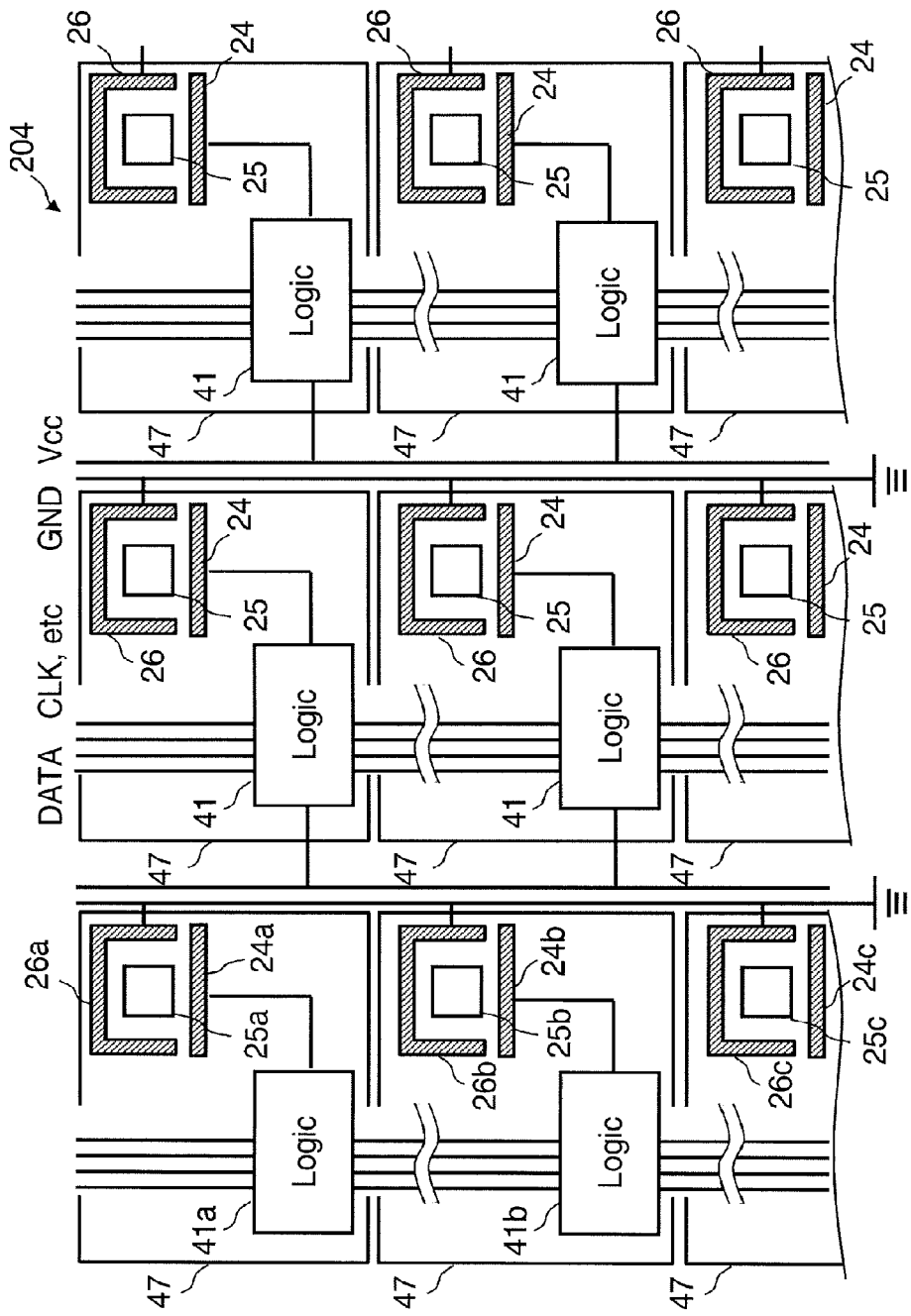
FIG. 4 is a top view conceptual diagram showing a part of a configuration in a membrane region of a blanking aperture array mechanism according to the first embodiment.

FIG. 3 is a sectional view showing the configuration of a blanking aperture array mechanism according to the first embodiment. FIG. 4 is a top view conceptual diagram showing a part of the configuration in a membrane region of a blanking aperture array mechanism according to the first embodiment. Between FIGS. 3 and 4, the positional relation among a control electrode 24, a counter electrode 26, a control circuit 41, and a pad 43 is not in accordance with each other. With regard to the configuration of the blanking aperture array mechanism 204, as shown in FIG. 3, a semiconductor substrate 31 made of silicon, etc. is placed on a support table 33. The central part of the substrate 31 is shaved from the back side and processed to be a membrane region 30 (first region) having a thin film thickness h. The circumference surrounding the membrane region 30 is a circumference region 32 (second region) having a thick film thickness H. The upper surface of the membrane region 30 and the upper surface of the circumference region 32 are formed to be at the same height position, or substantially at the same height position. At the backside of the circumference region 32, the substrate 31 is supported to be on the support table 33. The central part of the support table 33 is open, and the position of the membrane region 30 is located in the opening part of the support table 33.

In the membrane region 30, there are formed passage holes 25 (second opening), through which multi-beams individually pass, at the positions corresponding to the holes 22 (first opening) of the shaping aperture array substrate 203 shown in FIG. 2. In other words, in the membrane region 30 of the substrate 31, there are formed a plurality of passage holes 25 in an array through each of which a corresponding electron beam of multi-beams passes. Moreover, in the membrane region 30 of the substrate 31, a plurality of electrode pairs each composed of two electrodes arranged to be opposite each other with respect to a corresponding one of a plurality of passage holes 25. Specifically, in the membrane region 30, as shown in FIGS. 3 and 4, each pair of the control electrode 24 and the counter electrode 26 (blanker: blanking deflector) for blanking deflection is arranged close to a corresponding passage hole 25 in a manner such that the electrodes 24 and 26 are opposite each other with respect to the passage hole 25 concerned. Moreover, close to each passage hole 25 in the membrane region 30 of the substrate 31, there is arranged a control circuit 41 (logic circuit) for applying a deflection voltage to the control electrode 24 for the passage hole 25 concerned. The counter electrode 26 for each beam is grounded (earthed).

Moreover, as shown in FIG. 4, n-bit (e.g., 10-bit) parallel lines for control signals are connected to each control circuit 41. In addition to the n-bit parallel lines for controlling, clock signal lines, wiring lines for a power source, etc. are connected to each control circuit 41. A part of the parallel lines may be used as the clock signal lines and the power source wiring lines. An individual blanking mechanism 47 composed of the control electrode 24, the counter electrode 26, and the control circuit 41 is configured for each beam of the multi-beams. In the example of FIG. 3, the control electrode 24, the counter electrode 26, and the control circuit 41 are arranged in the membrane region 30 having a thin film thickness of the substrate 31. However, it is not limited thereto. A plurality of control circuits 41 formed in an array in the membrane region 30 are grouped by each row or each column, and the control circuits 41 in the same group are connected in series as shown in FIG. 4. A signal is transferred from the pad 43 arranged for each group to the control circuits 41 in the same group. Specifically, a shift register (not shown) is arranged in each control circuit 41, and for example, shift registers in the control circuits for beams in the same row in pxq multiple beams, for example, are connected in series. For example, control signals for beams in the same row in the pxq multiple beams are transmitted in series. For example, a control signal for each beam is stored in a corresponding control circuit 41 by clock signals performed p times.

In the control circuit 41, an amplifier (not shown) (an example of a switching circuit) is arranged. As an example of the amplifier, a CMOS (complementary MOS) inverter circuit is arranged. The CMOS inverter circuit is connected to a positive potential (Vdd: blanking electric potential: first electric potential) (e.g., 5 V) (first electric potential) and to a ground potential (GND: second electric potential). The output line (OUT) of the CMOS inverter circuit is connected to the control electrode 24. On the other hand, the counter electrode 26 is applied with a ground electric potential.

As the input (IN) of the CMOS inverter circuit, either an L (low) electric potential (e.g., ground potential) lower than a threshold voltage, or an H (high) electric potential (e.g., 1.5 V) higher than or equal to the threshold voltage is applied as a control signal. According to the first embodiment, in the state (active state) where an H electric potential is applied to the input (IN) of the CMOS inverter circuit, the output (OUT) of the CMOS inverter circuit becomes a positive potential (Vdd), and it is controlled to be beam OFF by deflecting a corresponding beam 20 by an electric field due to a potential difference against the ground potential of the counter electrode 26, and by performing blocking using the limiting aperture substrate 206. On the other hand, in the state where an L electric potential is applied to the input (IN) of the CMOS inverter circuit, the output (OUT) of the CMOS inverter circuit becomes a ground potential, and therefore, since there is no potential difference against the ground potential of the counter electrode 26, a corresponding beam 20 is not deflected. Accordingly, it is controlled to be beam ON by letting the beam pass through the limiting aperture substrate 206.

The electron beam 20 passing through a corresponding passage hole is deflected by a voltage independently applied to the corresponding control electrode 24 of a corresponding pair of the control electrode 24 and the counter electrode 26 for each electron beam 20. Blanking control is performed by this deflection. Specifically, a pair of the control electrode 24 and the counter electrode 26 individually provides blanking deflection of a corresponding beam of multi-beams by an electric potential switched by the CMOS inverter circuit which serves as a corresponding switching circuit. Thus, using a plurality of electrodes, the blanking aperture array mechanism 204 individually performs blanking deflection of each beam of multi-beams having passed through a plurality of holes 22 (openings) of the shaping aperture array substrate 203.

Figure 5:
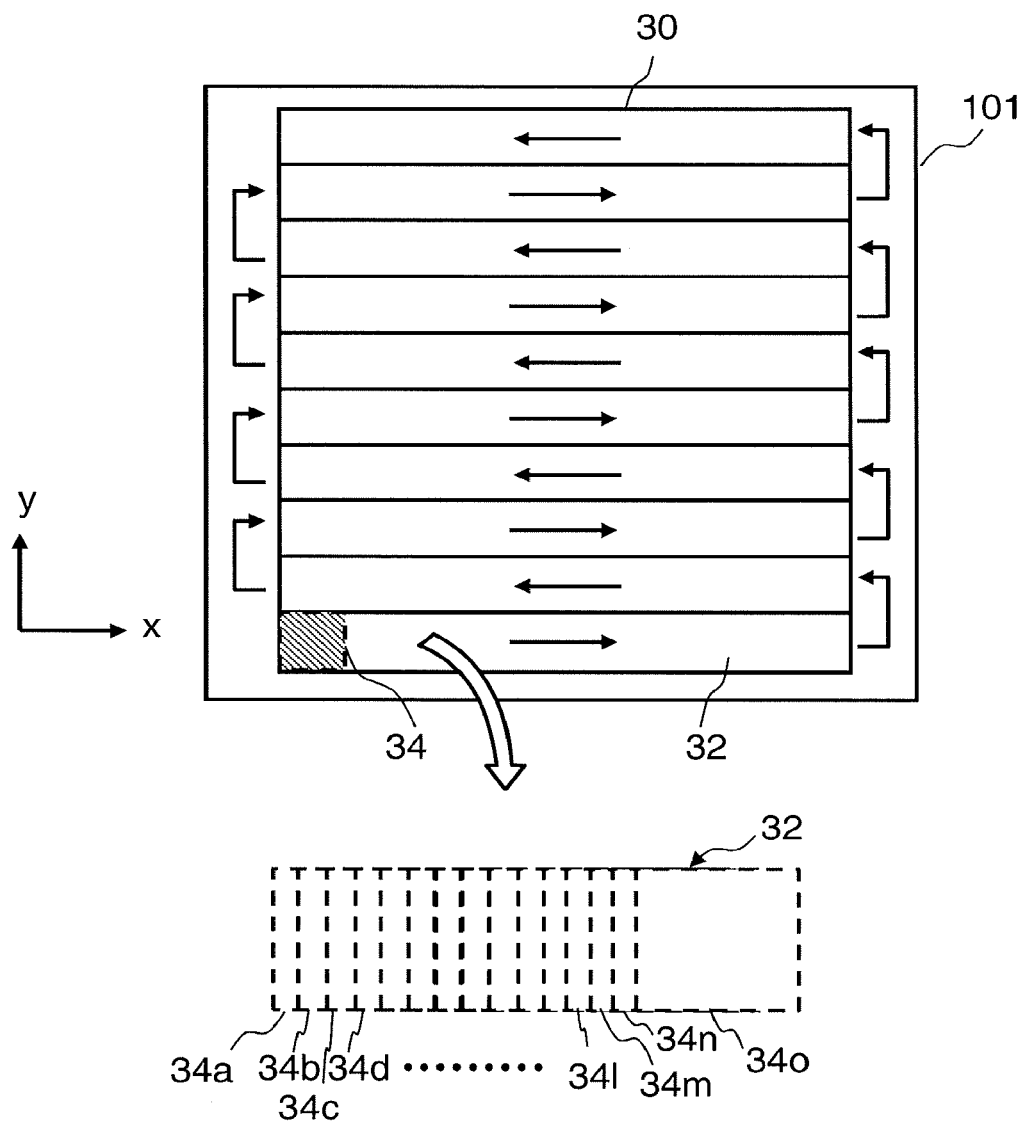
FIG. 5 is a conceptual diagram explaining an example of a writing operation according to the first embodiment.

FIG. 5 is a conceptual diagram explaining an example of a writing operation according to the first embodiment. As shown in FIG. 5, a writing region 30 of the target object 101 is virtually divided by a predetermined width or "height" (to be a stripe width) in the y direction into a plurality of strip-shaped stripe regions 32, for example. First, the XY stage 105 is moved to make an adjustment such that an irradiation region 34 which can be irradiated with one shot of the multi-beams 20 is located at the left end of the first stripe region 32 or at a position more left than the left end, and then writing is started. When writing the first stripe region 32, the XY stage 105 is moved, for example, in the −x direction, so that the writing advances relatively in the x direction. The XY stage 105 is moved, for example, continuously at a constant speed. After writing the first stripe region 32, the stage position is moved in the −y direction to make an adjustment such that the irradiation region 34 is located at the right end of the second stripe region 32 or at a position more right than the right end and located relatively in the y direction. Then, by moving the XY stage 105 in the x direction, for example, writing similarly advances in the −x direction. That is, writing is performed while alternately changing the direction, such as performing writing in the x direction in the third stripe region 32, and in the −x direction in the fourth stripe region 32, and thus, the writing time can be reduced. However, the writing operation is not limited to the case of performing writing while alternately changing the direction, and it is also preferable to perform writing in the same direction when writing each stripe region 32. A plurality of shot patterns, whose number is equal to the number of the holes 22 at the maximum, are formed at a time by one shot (total of irradiation steps to be described later) of multi-beams which have been formed by passing through each of the holes 22 of the shaping aperture array substrate 203.

Figure 6:
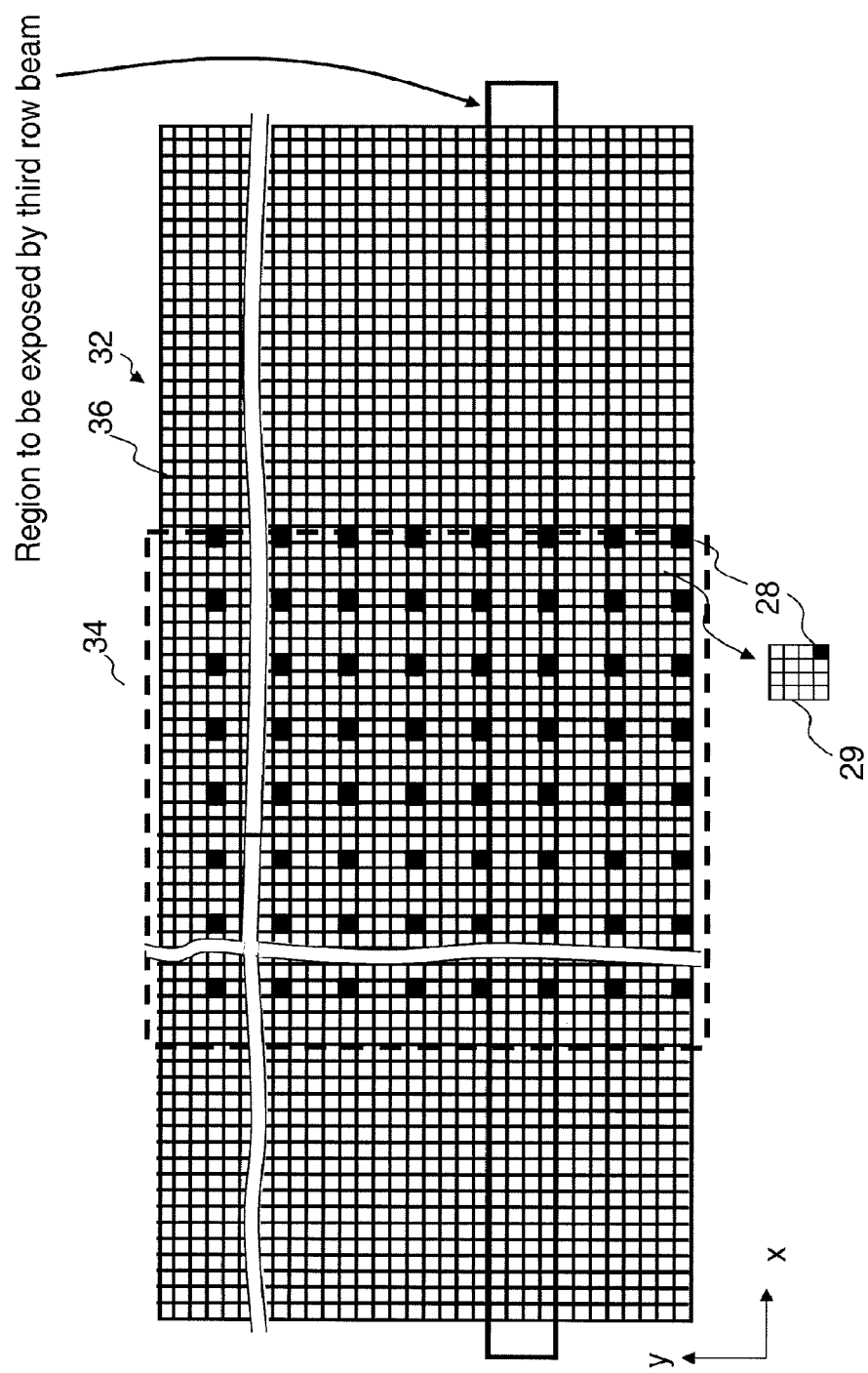
FIG. 6 shows an example of an irradiation region of multi-beams and a pixel to be written according to the first embodiment.

FIG. 6 shows an example of an irradiation region of multi-beams and a pixel to be written (writing pixel) according to the first embodiment. In FIG. 6, the stripe region 32 is divided into a plurality of mesh regions by the size of each beam of the multi-beams, for example. Each mesh region serves as a writing pixel 36 (unit irradiation region, or writing position). The size of the writing pixel 36 is not limited to the beam size, and it may be an arbitrary size regardless of the beam size. For example, it may be 1/n (n being an integer of 1 or more) of the beam size. FIG. 6 shows the case where the writing region of the target object 101 is divided in the y direction into a plurality of stripe regions 32 by the width size being substantially the same as the size of the irradiation region 34 (writing field) which can be irradiated by one time irradiation of the multi-beams 20, for example. The width of the stripe region 32 is not limited to this. It is also preferable for the width of the stripe region 32 to be n times (n being an integer of 1 or more) the size of the irradiation region 34. FIG. 6 shows the case of multi-beams of 512×512 (rows by columns). In the irradiation region 34, there are shown a plurality of pixels 28 (writing positions of beams) which can be irradiated by one shot of the multi-beams 20. In other words, the pitch between the adjacent pixels 28 is the pitch between beams of the multi-beams. In the example of FIG. 6, one grid 29 is a square region surrounded at four corners by four adjacent pixels 28, and including one of the four pixels 28. In the example of FIG. 6, each grid 29 is configured by 4×4 pixels.

Figure 7:
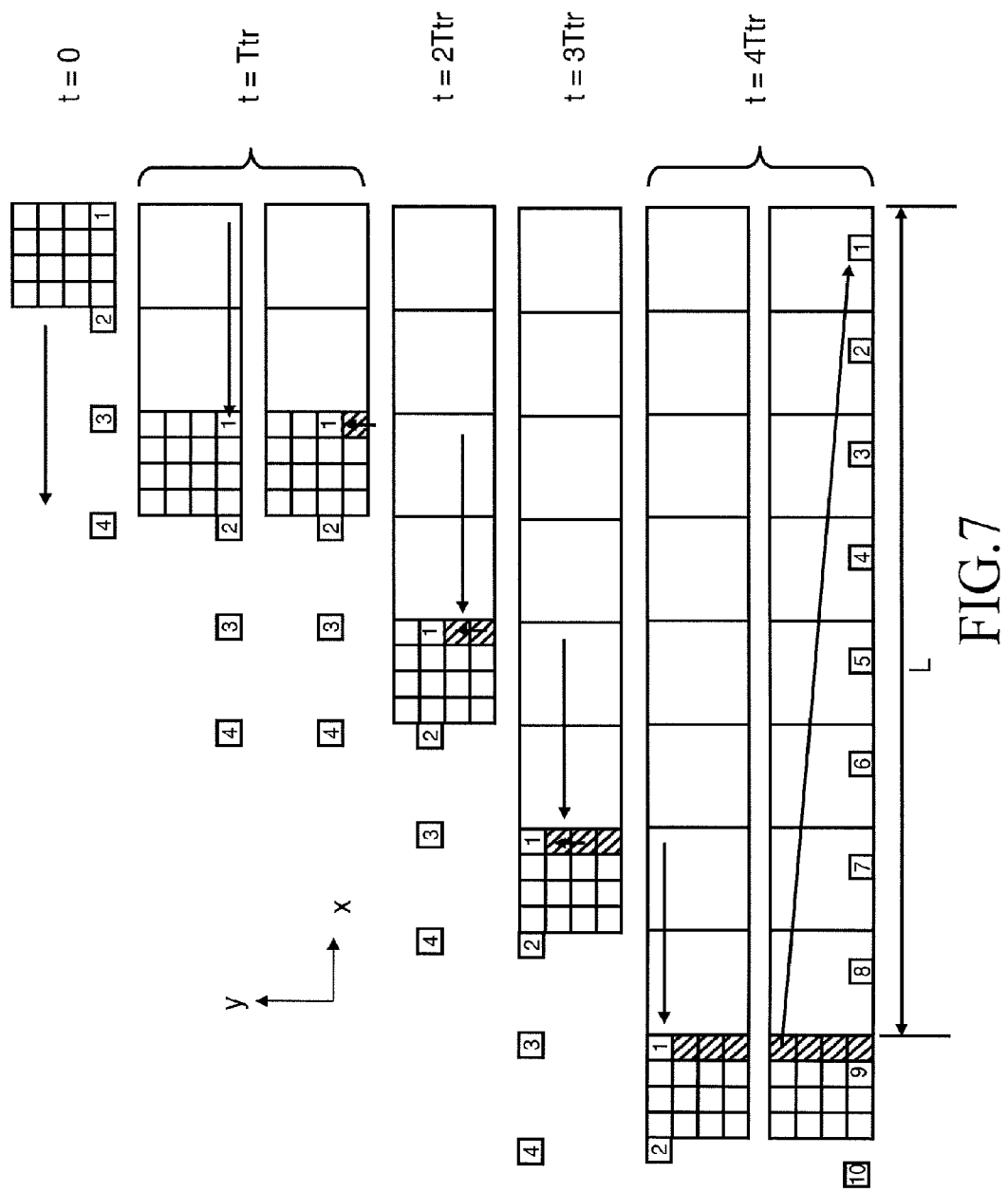
FIG. 7 illustrates an example of a writing method of multi-beams according to the first embodiment.

FIG. 7 illustrates an example of a writing method of multi-beams according to the first embodiment. FIG. 7 shows some grids to be written by respective beams at the coordinates (1, 3), (2, 3), (3, 3), . . . , (512, 3) in the third row from the bottom in the y direction in the multi-beams for writing the stripe region 32 shown in FIG. 6. In the example of FIG. 7, while the XY stage 105 moves the distance of eight beam pitches, four pixels are written (exposed), for example. In order that the relative position between the irradiation region 34 and the target object 101 may not shift by the movement of the XY stage 105 while these four pixels are written (exposed), the irradiation region 34 is made to follow the movement of the XY stage 105 by collectively deflecting the entire multi-beams 20 by the deflector 208. In other words, tracking control is performed. In the example of FIG. 7, one tracking cycle is executed by writing (exposing) four pixels while moving the distance of eight beam pitches.

Specifically, the stage position measuring instrument 139 measures the position of the XY stage 105 by irradiating the mirror 210 with a laxer and receiving a catoptric light from the mirror 210. The measured position of the XY stage 105 is output to the control computer 110. In the control computer 110, the writing control unit 86 outputs the position information on the XY stage 105 to the deflection control circuit 130. The deflection control circuit 130 calculates deflection amount data (tracking deflection data) for performing beam deflection to follow the movement of the XY stage 105. The tracking deflection data being a digital signal is converted to an analog signal and amplified by a DAC amplifier (not shown), and applied as a tracking deflection voltage to the main deflector 208.

The writing unit 150 irradiates each pixel 36 with a corresponding beam in the ON state in the multi-beams 20 during a writing time (irradiation time or exposure time) corresponding to each pixel 36 within the maximum writing time Ttr of the irradiation time of each beam of the multi-beams of the shot concerned.

In the example of FIG. 7, during from the time t=0 to t=Ttr being the maximum writing time, using a beam (1) of coordinates (1, 3), beam irradiation of the first shot composed of a plurality of irradiation steps (multiple exposures) is performed to the first pixel from the right in the bottom row of the grid 29 concerned. The XY stage 105 moves, for example, two beam pitches in the −x direction during from the time t=0 to t=Ttr. During this time period, the tracking operation is continuously performed.

After the maximum writing time Ttr of the shot concerned has passed since the start of beam irradiation of the shot concerned, while the beam deflection for tracking control is being continuously performed by the deflector 208, the writing position (previous writing position) of each beam is shifted to a next writing position (current writing position) of each beam by collectively deflecting the multi-beams 20 by the deflector 209, which is performed in addition to the beam deflection for tracking control. In the example of FIG. 7, when the time becomes t=Ttr, the pixel to be written (writing pixel) is shifted from the first pixel from the right in the bottom row of the grid 29 concerned to the first pixel from the right in the second row from the bottom. Since the XY stage 105 is moving at a fixed speed also during this time period, the tracking operation is continuously performed.

Then, while the tracking control is continued, respective beams in the ON state in the multi-beams 20 are applied to shifted writing positions corresponding to the respective beams during a writing time corresponding to each of the respective beams within a maximum writing time Ttr of the shot concerned. In the example of FIG. 7, the first pixel from the right in the second row from the bottom of the grid 29 concerned is irradiated by the second shot using the beam (1) of coordinates (1, 3) during the time from t=Ttr to t=2Ttr, for example. The XY stage 105 moves two beam pitches in the −x direction during the time from t=Ttr to t=2Ttr, for example. During this time period, the tracking operation is continuously performed.

In the example of FIG. 7, when the time becomes t=2Ttr, the pixel to be written (writing pixel) is shifted from the first pixel from the right in the second row from the bottom of the grid 29 concerned to the first pixel from the right in the third row from the bottom by collectively deflecting the multi-beams by the deflector 208. Since the XY stage 105 is moving also during this time period, the tracking operation is continuously performed. Then, the first pixel from the right in the third row from the bottom of the grid 29 concerned is irradiated by the third shot using the beam (1) of coordinates (1, 3) during the time from t=2Ttr to t=3Ttr, for example. The XY stage 105 moves two beam pitches in the −x direction during the time from t=2Ttr to t=3Ttr, for example. During this time period, the tracking operation is continuously performed. When the time becomes t=3Ttr, the pixel to be written (writing pixel) is shifted from the first pixel from the right in the third row from the bottom of the grid 29 concerned to the first pixel from the right in the fourth row from the bottom by collectively deflecting the multi-beams by the deflector 208. Since the XY stage 105 is moving also during this time period, the tracking operation is continuously performed. Then, the first pixel from the right in the fourth row from the bottom of the grid 29 concerned is irradiated by the fourth shot using the beam (1) of coordinates (1, 3) during the time from t=3Ttr to t=4Ttr, for example. The XY stage 105 moves two beam pitches in the −x direction during the time from t=3Ttr to t=4Ttr, for example. During this time period, the tracking operation is continuously performed. By the process described above, writing of the pixels in the first column from the right of the grid 29 concerned has been completed.

In the example of FIG. 7, after emitting a corresponding beam to the writing position of each beam which has been shifted three times from the initial position, the tracking position is returned to the start position of tracking where the tracking control was started, by resetting the beam deflection for tracking control. In other words, the tracking position is returned in the opposite direction to the direction of the stage movement. In the example of FIG. 7, when the time becomes t=4Ttr, tracking of the grid 29 concerned is released (removed), and the beam is swung back to a new target grid which has been shifted by eight beam pitches in the x direction. Although the beam (1) of the coordinates (1,3) has been described in the example of FIG. 7, writing is also similarly performed for each grid corresponding to abeam of other coordinates. That is, abeam of coordinates (n, m) completes writing of pixels in the first column from the right of a corresponding grid when the time becomes t=4Ttr. For example, a beam (2) of coordinates (2,3) completes writing of pixels in the first column from the right of a grid adjacent in the −x direction to the grid 29 concerned for the beam (1) of FIG. 7.

Since writing of the pixels in the first column from the right of each grid has been completed, in a next tracking cycle after resetting the tracking, the deflector 208 performs deflection such that the writing position of each corresponding beam is adjusted (shifted) to the second pixel from the right in the first row from the bottom of each grid.

As described above, each shot is performed while shifting the irradiation position pixel by pixel by the deflector 208 in a state such that the relative position of the irradiation region 34 to the target object 101 is controlled by the deflector 208 to be unchanged during the same tracking cycle. Then, after finishing one tracking cycle and returning the tracking position of the irradiation region 34, as shown in the lower part of FIG. 5, the first shot position is adjusted to be the position shifted by one pixel, for example. Then, while performing a next tracking control, each shot is performed shifting the irradiation position by one pixel by the deflector 208. By repeating this operation during writing the stripe region 32, the position of the irradiation region 34 is shifted one by one, such as from 34a to 34o, to perform writing of the stripe region concerned.

Although, in the example described above, the deflector 208 performs both the tracking deflection and the shift deflection, it is not limited thereto. It is also preferable that a plurality of deflectors (for example, two deflectors) separately control the tracking deflection and the shift deflection. Next, concrete operations of the writing unit 150 is described below.

The electron beam 200 emitted from the electron gun 201 (emitter) is refracted by the illumination lens 202 so as to illuminate the whole of the shaping aperture array substrate 203. A plurality of quadrangular holes 22 (first openings) are formed in the shaping aperture array substrate 203. The region including all the plurality of holes 22 is irradiated by the electron beam 200. For example, a plurality of quadrangular electron beams (multi-beams) 20a to 20e are formed by letting portions of the electron beam 200, which irradiates the positions of the plurality of holes 22, individually pass through a corresponding hole of the plurality of holes 22 of the shaping aperture array substrate 203. Thus, the shaping aperture array substrate 203 forms the multi-beams 20, and also shapes the multi-beams 20. The multi-beams 20a to 20e individually pass through corresponding blankers (pair of the control electrode 24 and the counter electrode 26) (first deflector: individual blanking mechanism 47) of the blanking aperture array mechanism 204. The blanker provides blanking control such that at least electron beam 20 individually passing through the blanker becomes an ON state during the writing time (irradiation time) having been set.

The multi-beams 20a to 20e which have passed through the blanking aperture array mechanism 204 are refracted by the illumination lens in order to go toward the hole in the center of the limiting aperture substrate 206. Then, the multi-beams 20a to 20e form a crossover (C.O.) at the height position of the center hole (third opening) of the limiting aperture substrate 206. At this stage, the electron beam 20 which was deflected by the blanker of the blanking aperture array mechanism 204 deviates from the hole in the center of the limiting aperture substrate 206 (blanking aperture member) and is blocked by the limiting aperture substrate 206. On the other hand, the electron beam 20 which was not deflected by the blanker of the blanking aperture array mechanism 204 passes through the hole in the center of the limiting aperture substrate 206 as shown in FIG. 1. Thus, the limiting aperture substrate 206 blocks each beam which was deflected to be an OFF state by the individual blanking mechanism 47. Then, each beam of one shot is formed by a beam made during a period from becoming "ON" to becoming "OFF" and having passed through the limiting aperture substrate 206. The multi-beams 20 form an aperture image (image of an aperture array by the multi-beams 20) of the holes 22 of the shaping aperture array substrate 203. The multi-beams 20 by each beam having passed through the limiting aperture substrate 206 form an aperture image of a desired reduction ratio by being reduced by the electromagnetic lens group 212 individually excited by the lens control circuit 132, and are focused onto the target object 101. Then, beams (the whole of the multi-beams 20) having individually passed through the limiting aperture substrate 206 are collectively deflected in the same direction by the deflector 208 in order to irradiate respective beam irradiation positions on the target object 101. Thus, the electromagnetic lens group 212 configured by a plurality of stages of electromagnetic lenses 213, 214, 215, and 216 functions as an objective lens. While the XY stage 105 is continuously moving, controlling is performed by the deflector 208 so that the irradiation positions of the beams may follow (track) the movement of the XY stage 105, for example. The multi-beams 20 irradiating at a time are ideally aligned at pitches obtained by multiplying the arrangement pitch of a plurality of holes 22 of the shaping aperture array substrate In order to reduce the multi-beams 20 by a high reduction ratio, it is necessary to combine a plurality of stages of electromagnetic lenses.

Figure 8:
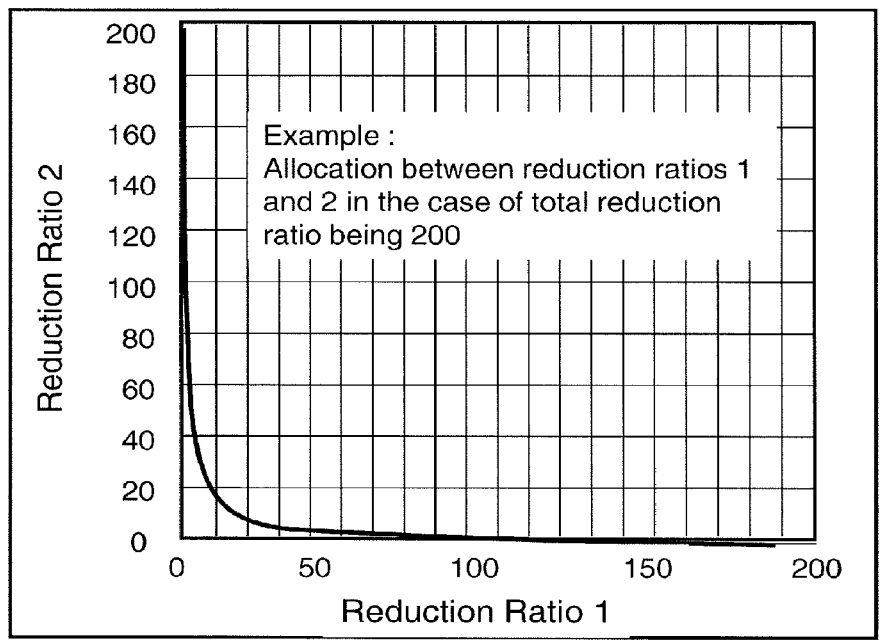
FIG. 8 shows a relation of reduction ratios of an electromagnetic lens group of two stages in the case of reducing multi-beams by a total reduction ratio of 200:1 according to the first embodiment.

FIG. 8 shows a relation of reduction ratios of an electromagnetic lens group of two stages in the case of reducing multi-beams by a total reduction ratio of 200:1 according to the first embodiment. In FIG. 8, the abscissa axis represents the reduction ratio 1 of the upstream-side electromagnetic lens, and the ordinate axis represents the reduction ratio 2 of the downstream-side electromagnetic lens of the two-stage electromagnetic lens group. As shown in FIG. 8, a desired total reduction ratio (200:1) is obtained as a product of the reduction ratio 1 and the reduction ratio 2. For example, when using two-stage electromagnetic lenses of the same reduction ratio, (reduction ratio 1)×(reduction ratio 2)=14.1×14.1 (rounding down to one decimal place).

Figure 9:
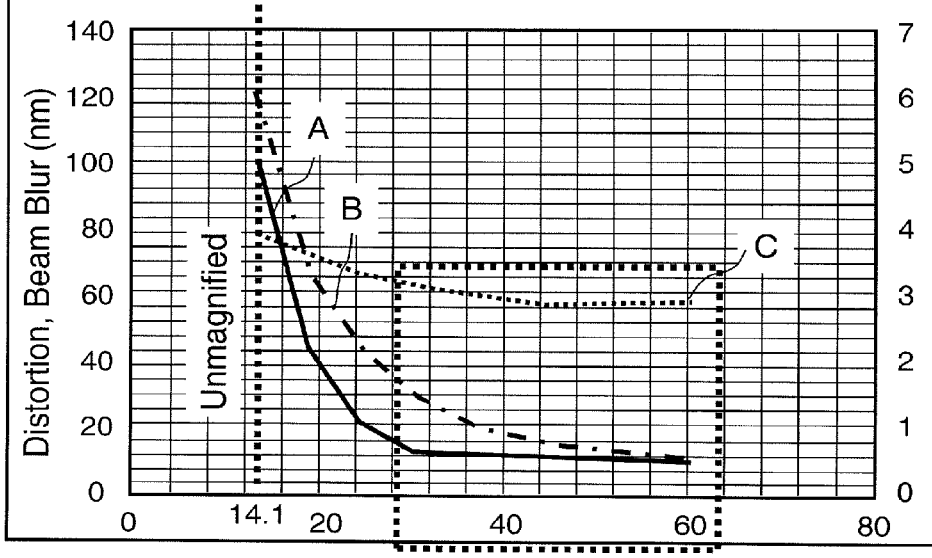
FIG. 9 shows an example of relation among a reduction ratio of an upstream-side electromagnetic lens, distortion of a formed (focused) aperture image in the case of forming an image of an aperture array by multi-beams, and beam blur, when reducing multi-beams by a total reduction ratio of 200:1 according to the first embodiment.

FIG. 9 shows an example of relation among a reduction ratio of an upstream-side electromagnetic lens, distortion of_a formed aperture image in the case of forming an image of an aperture array by multi-beams, and beam blur, when reducing multi-beams by a total reduction ratio of 200:1 according to the first embodiment. In FIG. 9, the left-hand side ordinate axis represents distortion of a formed image, the right-hand side ordinate axis does beam blur, and the abscissa axis does the reduction ratio 1 of the upstream-side electromagnetic lens. The total reduction ratio is set to 200:1. According to the first embodiment, the electromagnetic lens group 212 of four or more stages reduces multi-beams, forms images of multi-beams, and corrects distortion in a formed aperture image by multi-beams. With respect to the electromagnetic lens group 212 of four or more stages, the first stage electromagnetic lens 213 and the second stage electromagnetic lens 214 correct distortion in a formed aperture image by multi-beams. The third and subsequent stage electromagnetic lenses mainly perform reduction and image formation of multi-beams. In the example of FIG. 1, the third stage electromagnetic lens 215 (equivalent to the upstream-side electromagnetic lens taking charge of reduction of multi-beams), and the fourth stage electromagnetic lens 216 (equivalent to the downstream-side electromagnetic lens taking charge of reduction of multi-beams) mainly perform reduction and image formation of multi-beams. When the electromagnetic lens group 212 is composed of five or more stages, the third to last-but-one electromagnetic lenses are equivalent to the upstream-side electromagnetic lens taking charge of reduction of multi-beams. Then, the last stage electromagnetic lens is equivalent to the downstream-side electromagnetic lens taking charge of reduction of multi-beams. FIG. 9 shows distortion of a formed aperture image and beam blur of multi-beams in the case of making variable the reduction ratio 1 of the third stage electromagnetic lens 215 of FIG. 1 equivalent to the upstream-side electromagnetic lens taking charge of reduction of multi-beams. The graph A in FIG. 9 shows the amount of distortion in a formed aperture image of multi-beams in the case of adjusting excitation such that distortion in a formed image is corrected by electromagnetic lenses of two stages (the first stage electromagnetic lens 213 (OL1) and the second stage electromagnetic lens 214 (OL2)) at the upper stream side than the electromagnetic lenses of two stages taking charge of reduction of multi-beams. The graph B shows the amount of distortion in a formed aperture image of multi-beams in the case of not performing excitation adjustment (that is, not exciting) for correcting distortion of a formed image by electromagnetic lenses of two stages (the first stage electromagnetic lens 213 (OL1) and the second stage electromagnetic lens 214 (OL2)) at the upper stream side than electromagnetic lenses of two stages taking charge of reduction of multi-beams. The graph C shows beam blur. As shown in the graph A, when excitation is adjusted such that distortion of a formed image is corrected by the first stage electromagnetic lens 213 and the second stage electromagnetic lens 214 at the upstream-side, if the reduction ratio 1 of the third stage electromagnetic lens 215 taking charge of reduction of multi-beams is set to 30:1 or more, for example, the distortion of a formed aperture image by the multi-beams 20 can be converged close to the minimum value. Moreover, as shown in the graph B, even when excitation adjustment for correcting distortion in a formed image by the first stage electromagnetic lens 213 and the second stage electromagnetic lens 214 at the upstream side is not performed, distortion of a formed aperture image by the multi-beams 20 can be inhibited in accordance with increasing the reduction ratio 1 of the third stage electromagnetic lens 215 taking charge of reduction of multi-beams. Moreover, as shown in the graph C, it turns out that increasing the reduction ratio 1 of the third stage electromagnetic lens 215 taking charge of reduction of multi-beams works to inhibit blur of the multi-beams 20. Therefore, when the total reduction ratio is 200:1, it turns out to be preferable to make the reduction ratio 1 of the third stage electromagnetic lens 215 taking charge of reduction of multi-beams larger than the reduction ratio 2 of the fourth stage electromagnetic lens 216. Particularly, it turns out to be preferable to set the reduction ratio 1 of the third stage electromagnetic lens 215 taking charge of reduction of multi-beams to 1:30 or more. Then, the reduction ratio 2 of the fourth stage, being the last stage, electromagnetic lens 216 becomes extraordinarily smaller than the reduction ratio 1 of the third stage, being the last-but-one stage, electromagnetic lens 215. On the contrary, when using two-stage electromagnetic lenses (14.1×14.1) of the same reduction ratio, it turns out that distortion of a formed aperture image by the multi-beams 20 becomes larger. Moreover, if making the reduction ratio 1 of the third stage electromagnetic lens 215 taking charge of reduction of multi-beams smaller than the reduction ratio 2 of the fourth stage electromagnetic lens 216, it leads to further increase the distortion of a formed aperture image by the multi-beams 20.

Figure 10:
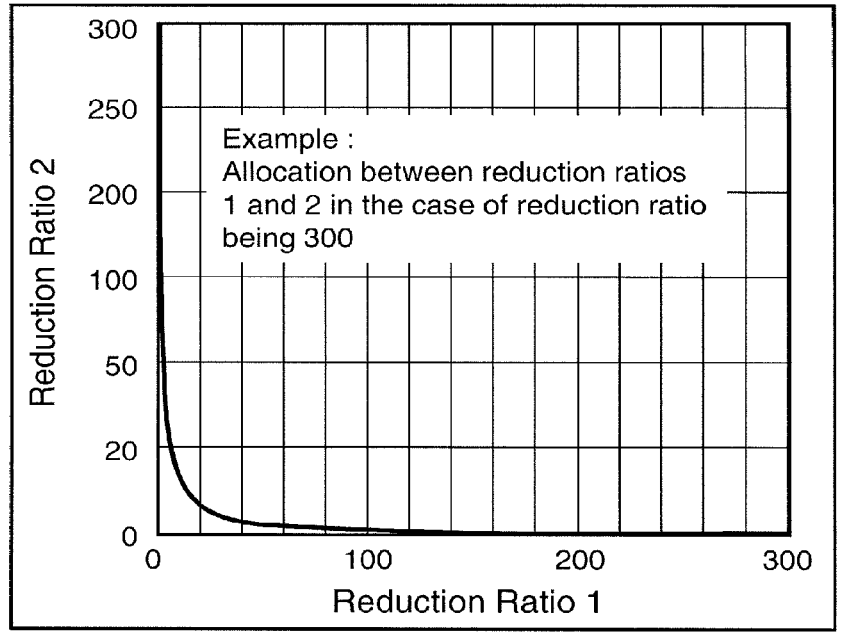
FIG. 10 shows a relation of reduction ratios of an electromagnetic lens group of two stages in the case of reducing multi-beams by a total reduction ratio of 300:1 according to the first embodiment.

FIG. 10 shows a relation of reduction ratios of an electromagnetic lens group of two stages in the case of reducing multi-beams by a total reduction ratio of 300:1 according to the first embodiment. In FIG. 10, the abscissa axis represents the reduction ratio 1 of the upstream-side electromagnetic lens, and the ordinate axis represents the reduction ratio 2 of the downstream-side electromagnetic lens. As shown in FIG. 10, a desired total reduction ratio (300:1) is obtained as a product of the reduction ratio 1 and the reduction ratio 2. For example, when using two-stage electromagnetic lenses of the same reduction ratio, (reduction ratio 1)×(reduction ratio 2)=17.3×17.3 (rounding down to one decimal place).

Figure 11:
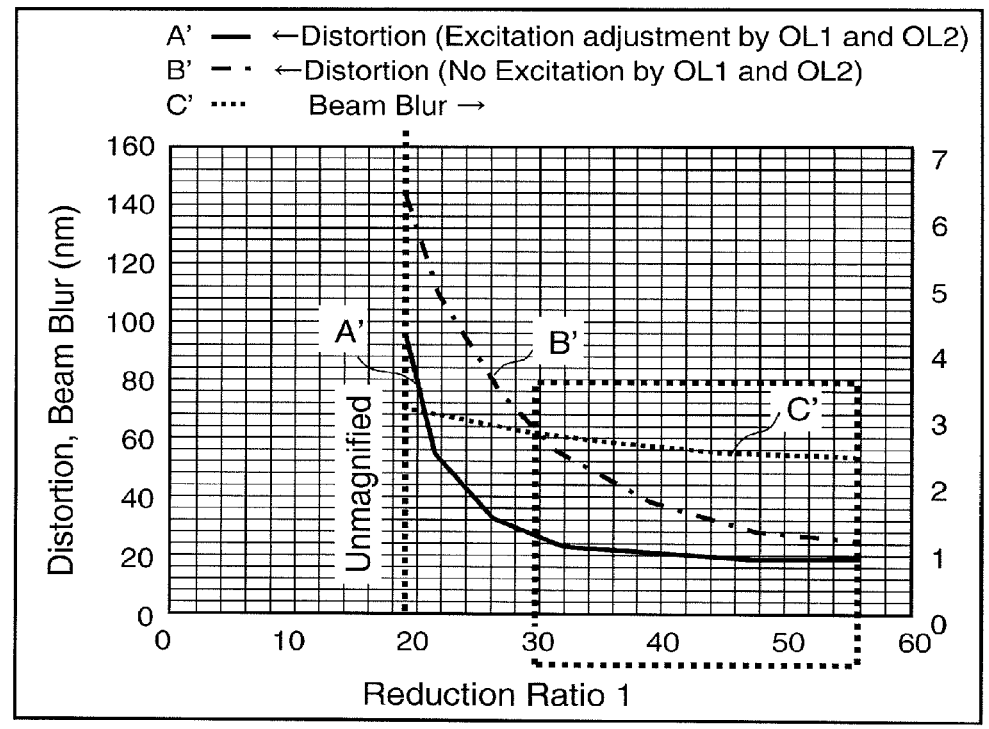
FIG. 11 shows an example of relation among a reduction ratio of an upstream-side electromagnetic lens, distortion of a formed aperture image in the case of forming an image of an aperture array by multi-beams, and beam blur, when reducing multi-beams by a total reduction ratio of 300:1 according to the first embodiment.

FIG. 11 shows an example of relation among a reduction ratio of an upstream-side electromagnetic lens, distortion of a formed aperture image in the case of forming an image of an aperture array by multi-beams, and beam blur, when reducing multi-beams by a total reduction ratio of 300:1 according to the first embodiment. In FIG. 11, the left-hand side ordinate axis represents distortion of a formed image, the right-hand side ordinate axis does beam blur, and the abscissa axis does the reduction ratio 1 of the third stage electromagnetic lens 215 (equivalent to an upstream-side electromagnetic lens taking charge of reduction of multi-beams). The total reduction ratio is set to 300:1. FIG. 11 shows distortion in a formed aperture image and beam blur of multi-beams in the case of making variable the reduction ratio 1 of the third stage electromagnetic lens 215 taking charge of reduction of multi-beams. The graph A' in FIG. 11 shows the amount of distortion of a formed aperture image of multi-beams in the case of adjusting excitation such that the distortion of the formed image is corrected by electromagnetic lenses of two stages (the first stage electromagnetic lens 213 (OL1) and the second stage electromagnetic lens 214 (OL2)) at the upper stream side than the electromagnetic lenses of two stages mainly taking charge of reduction of multi-beams. The graph B' shows the amount of distortion of a formed aperture image of multi-beams in the case of not performing excitation adjustment (that is, not exciting) for correcting the distortion in the formed image by electromagnetic lenses of two stages (the first stage electromagnetic lens 213 (OL1) and the second stage electromagnetic lens 214 (OL2)) at the upper stream side than electromagnetic lenses of two stages mainly taking charge of reduction of multi-beams. The graph C' shows beam blur. As shown in the graph A', when excitation is adjusted such that distortion in a formed image is corrected by the two-stage electromagnetic lenses at the upstream-side (the first stage electromagnetic lens 213 and the second stage electromagnetic lens 214), if the reduction ratio 1 of the third stage electromagnetic lens 215 taking charge of reduction of multi-beams is set to 30:1 or more, for example, the distortion of a formed aperture image by the multi-beams 20 can be converged close to the minimum value. Moreover, as shown in the graph B', even when excitation adjustment for correcting distortion in a formed image by the two-stage electromagnetic lenses at the upstream-side (the first stage electromagnetic lens 213 and the second stage electromagnetic lens 214) is not performed, distortion in a formed aperture image by the multi-beams 20 can be inhibited in accordance with increasing the reduction ratio 1 of the third stage electromagnetic lens 215 taking charge of reduction of multi-beams. Moreover, as shown in the graph C', it turns out that increasing the reduction ratio 1 of the third stage electromagnetic lens 215 taking charge of reduction of multi-beams works to inhibit blur of the multi-beams 20. Therefore, even when the total reduction ratio is 300:1, it turns out to be preferable to make the reduction ratio 1 of the third stage electromagnetic lens 215 taking charge of reduction of multi-beams larger than the reduction ratio 2 of the fourth stage electromagnetic lens 216. Particularly, it turns out to be preferable to set the reduction ratio 1 of the third stage electromagnetic lens 215 taking charge of reduction of multi-beams to 30:1 or more. Then, the reduction ratio 2 of the fourth stage, being the last stage, electromagnetic lens 216 becomes extraordinarily smaller than the reduction ratio 1 of the third stage, being the last-but-one stage, electromagnetic lens 215. On the contrary, when using two-stage electromagnetic lenses (17.3×17.3) of the same reduction ratio, it turns out that distortion of a formed aperture image by the multi-beams 20 becomes larger. Moreover, if making the reduction ratio 1 of the third stage electromagnetic lens 215 taking charge of reduction of multi-beams smaller than the reduction ratio 2 of the fourth stage electromagnetic lens 216, it leads to further increase the distortion of a formed aperture image by the multi-beams 20.

Figure 12:
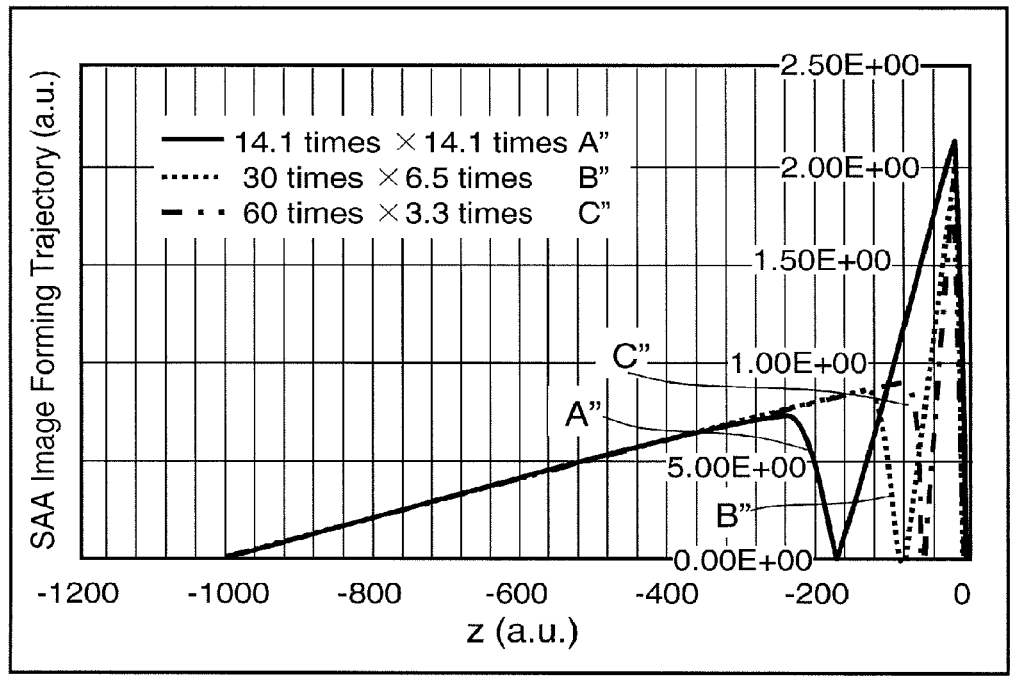
FIG. 12 shows an example of an image forming trajectory of an image of a corresponding aperture by the central beam of multi-beams according to the first embodiment.

FIG. 12 shows an example of an image forming trajectory of an image of a corresponding aperture by the central beam of multi-beams according to the first embodiment. In FIG. 12, the ordinate axis represents a position (a. u.) in the horizontal direction (e.g., x direction) from the optical axis of an image forming trajectory, and the abscissa axis represents a position (a. u.) in the height-wise direction (e.g., z direction) from the surface of the target object 101. Here, in order to keep a certain working distance (WD) from the surface of the target object 101, the arrangement height position of the fourth stage electromagnetic lens 216 of FIG. 1 is made fixed. Then, the arrangement height position of the third stage electromagnetic lens 215 is shifted according to combination of reduction ratios. In FIG. 12, the graph A" shows the combination of (reduction ratio 1 of the third stage electromagnetic lens 215)×(reduction ratio 2 of the fourth stage electromagnetic lens 216)=14.1×14.1, the graph B" shows the combination of 30×6.5, and the graph C" shows the combination of 60×3.3. Moreover, FIG. 12 shows the image forming trajectory of the image of the corresponding aperture by the central beam (beam 20c in FIG. 1) of the multi-beams 20 formed by passing through a plurality of holes 22 of the shaping aperture array substrate 203. As shown in FIGS. 1 and 12, the aperture image by the multi-beams 20 obtained by forming (focusing) the multi-beams 20 by using the shaping aperture array substrate 203 is once focused at the height position between the fourth stage, being the last stage, electromagnetic lens 216 and the third stage, being the last-but-one stage, electromagnetic lens 215, (that is, an image forming surface 1 is formed), by the third stage electromagnetic lens 215. Then, an aperture image by the multi-beams 20 is formed on the surface of the target object 101 by the fourth stage, being the last stage, electromagnetic lens 216, (that is, an image forming surface 2 is formed). As shown in FIG. 12, it turns out to be necessary to increase the reduction ratio 1 of the third stage electromagnetic lens 215 in accordance with shifting the image forming surface 1 toward the surface of the target object 101.

Figure 13:
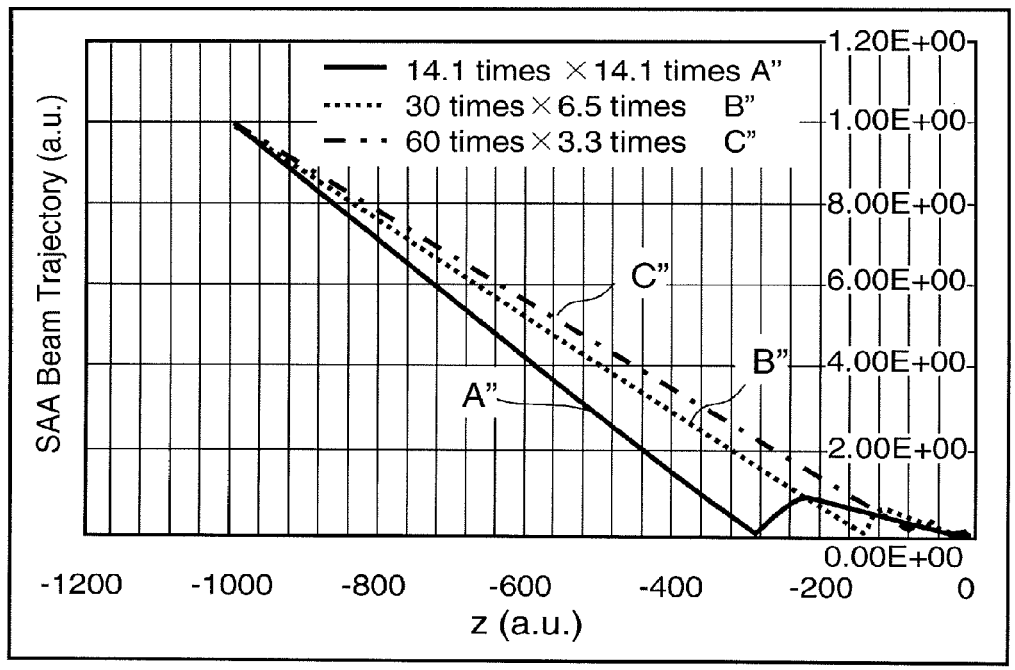
FIG. 13 shows an example of a beam trajectory of an edge beam of multi-beams according to the first embodiment.

FIG. 13 shows an example of a beam trajectory of an edge beam of multi-beams according to the first embodiment. In FIG. 13, the ordinate axis represents a position (a. u.) in the horizontal direction (e.g., x direction) from the optical axis of the trajectory, and the abscissa axis represents a position (a. u.) in the height-wise direction (e.g., z direction) from the surface of the target object 101. Here, as in FIG. 12, in order to keep a certain WD from the surface of the target object 101, the arrangement height position of the fourth stage electromagnetic lens 216 of FIG. 1 is made fixed. Then, the arrangement height position of the third stage electromagnetic lens 215 is shifted according to combination of reduction ratios. In FIG. 13, the graph A" shows the combination of (reduction ratio 1 of the third stage electromagnetic lens 215)×(reduction ratio 2 of the fourth stage electromagnetic lens 216)=14.1×14.1, the graph B" shows the combination of 30×6.5, and the graph C" shows the combination of 60×3.3. Moreover, FIG. 13 shows the beam trajectory of the edge beam (beam 20e in FIG. 1, and, after crossover, beam 20a) of the multi-beams 20 formed by passing through a plurality of holes 22 of the shaping aperture array substrate 203. Since FIG. 12 shows an image forming trajectory, the spread of a scattered object beam (beam 20c) is shown, but, FIG. 13 shows the trajectory of an object beam (beam 20e) itself without including the scattered portion. As shown in FIG. 13, it turns out that the larger the reduction ratio 1 of the third stage electromagnetic lens 215 is, the shorter the distance from the optical axis of the edge beam (beam 20a) at the time of passing through the third stage electromagnetic lens 215, i.e., the beam diameter of the entire multi-beams 20, can be. In the case of shifting the arrangement height position of the third stage electromagnetic lens 215 according to combination of reduction ratios, it goes without saying that since the height position of crossover of the multi-beams 20 changes, the arrangement height position of the limiting aperture substrate 206 also changes.

Figure 14:
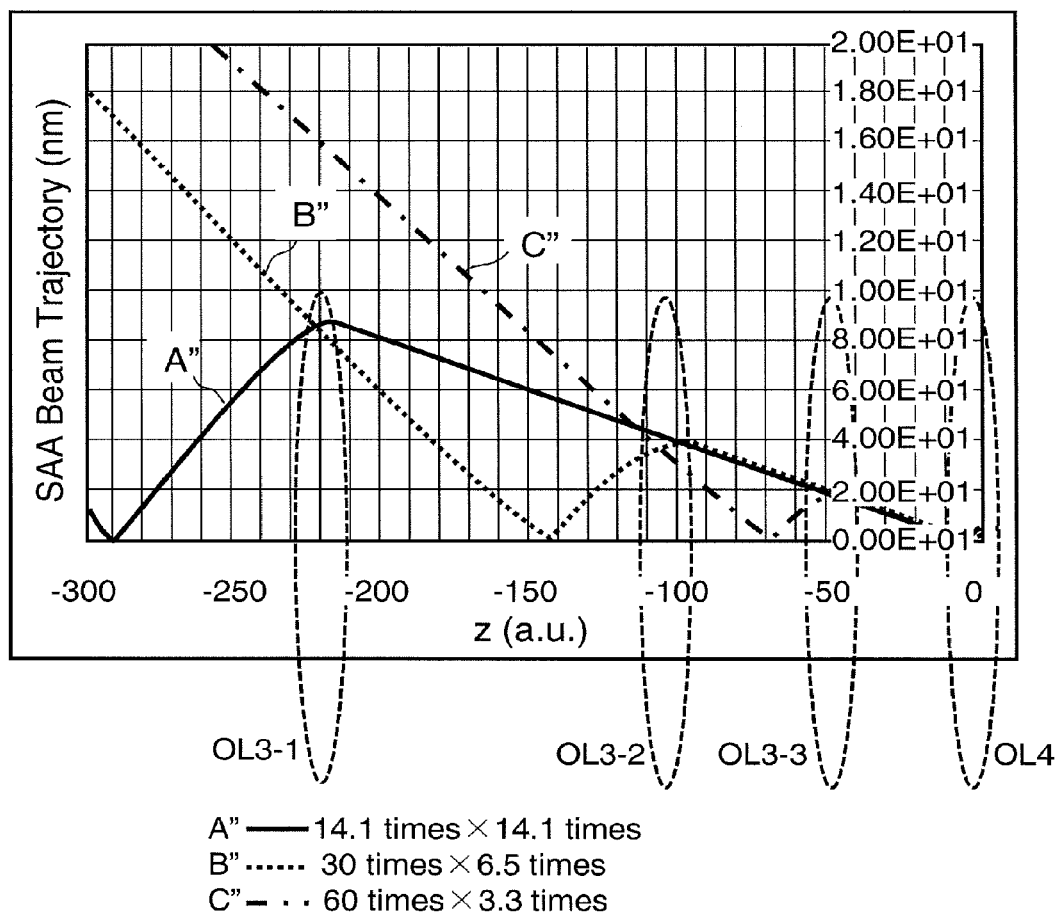
FIG. 14 shows an enlarged view of around the arrangement position of the third stage electromagnetic lens and the fourth stage electromagnetic lens in an example of a beam trajectory of an edge beam of multi-beams according to the first embodiment.

FIG. 14 shows an enlarged view of around the arrangement position of the third stage electromagnetic lens and the fourth stage electromagnetic lens in an example of a beam trajectory of an edge beam of multi-beams according to the first embodiment. As described above, in FIG. 14, the graph A" shows the combination of (reduction ratio 1 of the third stage electromagnetic lens 215)×(reduction ratio 2 of the fourth stage electromagnetic lens 216)=14.1×14.1, the graph B" shows the combination of 30×6.5, and the graph C" shows the combination of 60×3.3. As shown in the graph B" of FIG. 14, the beam diameter of the entire multi-beams 20 can be half or less by setting the reduction ratio 1 of the third stage electromagnetic lens 215 to 30:1 compared with the graph A" shown in an unmagnified manner. Moreover, as shown in the graph C", the beam diameter of the entire multi-beams 20 can further be half or less by setting the reduction ratio 1 of the third stage electromagnetic lens 215 to 60:1 compared with the graph B" shown by 30:1. In proportion as the beam diameter of the entire multi-beams 20 at the time of passing through the third stage electromagnetic lens 215 decreases, it becomes more possible to pass through the central part of the third stage electromagnetic lens 215, and therefore, distortion of a formed (focused) image of an aperture image by the multi-beams 20 can be made small.

Figure 15:
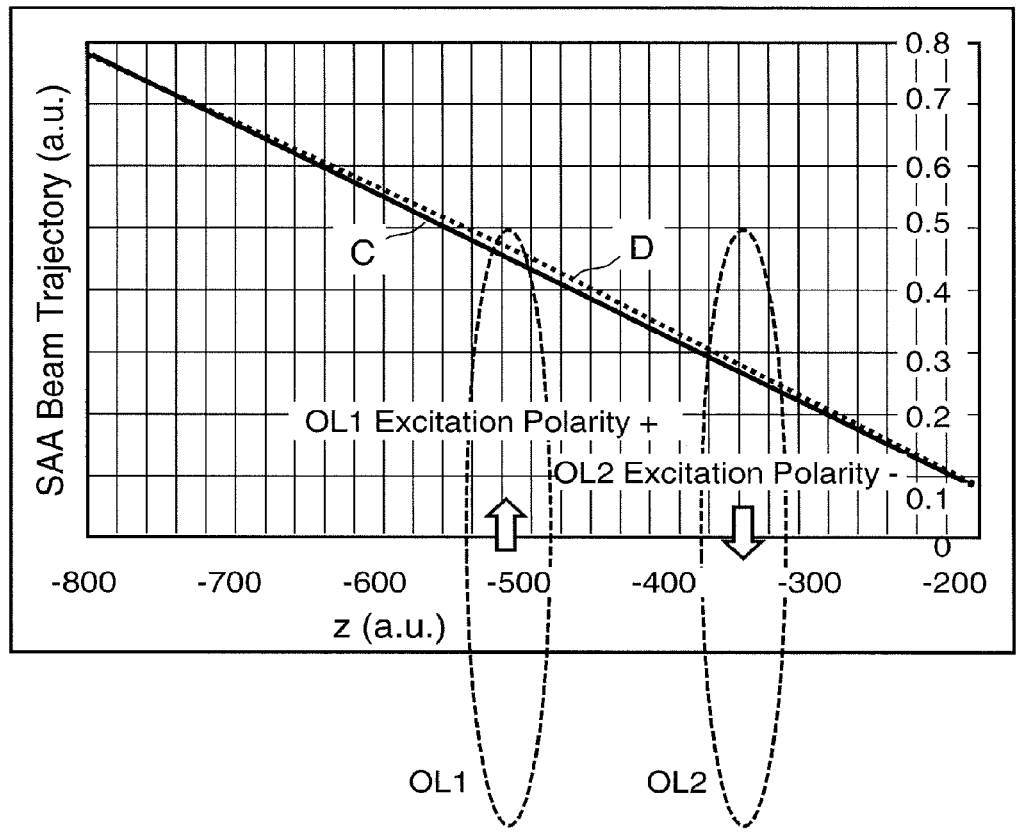
FIG. 15 shows an enlarged view of around the arrangement position of the first stage electromagnetic lens and the second stage electromagnetic lens in an example of a beam trajectory of an edge beam of multi-beams according to the first embodiment.

FIG. 15 shows an enlarged view of around the arrangement position of the first stage electromagnetic lens and the second stage electromagnetic lens in an example of a beam trajectory of an edge beam of multi-beams according to the first embodiment. In FIG. 15, the ordinate axis represents a position (a. u.) in the horizontal direction (e.g., x direction) from the optical axis of the trajectory, and the abscissa axis represents a position (a. u.) in the height-wise direction (e.g., z direction) from the surface of the target object 101. The beam trajectory of the edge beam of the multi-beams 20 shown in the graph C can be shifted to the beam trajectory of the edge beam of the multi-beams 20 shown in the graph D by exciting the first stage electromagnetic lens 213 and the second stage electromagnetic lens 214 such that they have reverse excitation polarities. In the example of FIG. 15, the first stage electromagnetic lens 213 is excited so as to have a positive excitation polarity. Thereby, the multi-beams 20 are pulled toward the pole piece side of the electromagnetic lens 213, and thus, the trajectory can be bent outward (off-axis direction). Then, the second stage electromagnetic lens 214 is excited so as to have a negative excitation polarity. Thereby, the beam having been bent outward is rebent inward (intra-axial direction).

Figure 16:
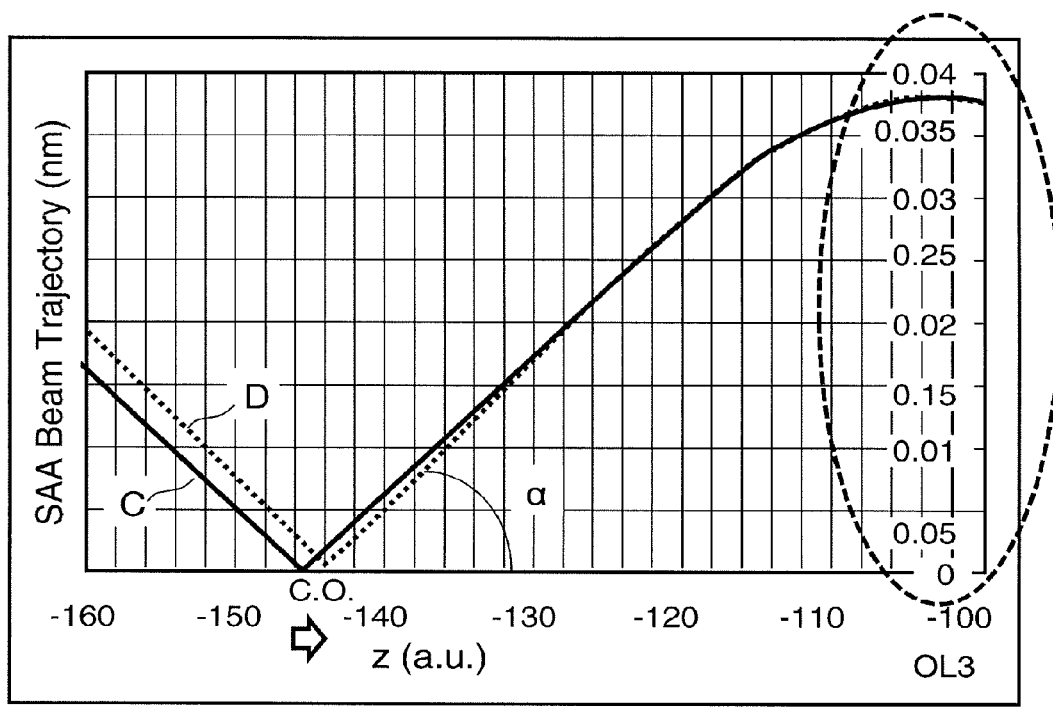
FIG. 16 shows an enlarged view of around the arrangement position of the third stage electromagnetic lens in an example of the beam trajectory of the edge beam of multi-beams whose trajectory has been corrected by the first stage electromagnetic lens and the second stage electromagnetic lens according to the first embodiment.

FIG. 16 shows an enlarged view of around the arrangement position of the third stage electromagnetic lens in an example of the beam trajectory of the edge beam of multi-beams whose trajectory has been corrected by the first stage electromagnetic lens and the second stage electromagnetic lens according to the first embodiment. The beam trajectory of the edge beam of the multi-beams 20 shown in the graph C can be shifted to the beam trajectory of the edge beam of the multi-beams 20 shown in the graph D by first bending the beam in the off-axis direction by the first stage electromagnetic lens 213, and then bending the beam in the intra-axial direction by the second stage electromagnetic lens 214. Thereby, the crossover position of the multi-beams 20 is shifted somewhat toward the downstream side, and thus, the incident angle α of the edge beam of the multi-beams 20 into the third stage electromagnetic lens 215 can be increased. In FIG. 16, the edge beam (the beam 20e in FIG. 1) indicates the beam 20a of FIG. 1 at the downstream side with respect to the crossover position. Thereby, the beam diameter of the entire multi-beams 20 at the time of passing through the third stage electromagnetic lens 215 can further be decreased. Therefore, distortion of a formed (focused) image of an aperture image by the multi-beams 20 can further be smaller.

In light of the results described above, the electromagnetic lens group 212 configured by electromagnetic lenses of a plurality of four or more stages is arranged according to the first embodiment. In FIG. 1, as an example, the electromagnetic lens group 212 is configured by the four-stage electromagnetic lenses 213, 214, 215, and 216. In that case, the third stage electromagnetic lens 215 and the fourth stage electromagnetic lens 216 are arranged such that the reduction ratio 1 of multi-beams by at least one electromagnetic lens (here, the third stage electromagnetic lens 215) of the stage before the last stage electromagnetic lens is larger than the reduction ratio 2 of multi-beams by the last fourth stage electromagnetic lens 216. In such a state, distortion of an aperture image by the multi-beams 20 is corrected by the first stage electromagnetic lens 213 and the second stage electromagnetic lens 214. Then, while distortion of a formed aperture image of multi-beams obtained by forming the multi-beams 20 is corrected, the multi-beams 20 is reduced by the third and subsequent stage electromagnetic lenses 215 and 216, and then, the corrected aperture image formed by the multi-beams 20 is focused (formed) at the height position between the last stage electromagnetic lens 216 and the last-but-one stage electromagnetic lens 215, and on the surface of the target object 101.

Moreover, according to the first embodiment, the distance between the electromagnetic lenses of the reduction optical system is short in order to achieve a high total reduction ratio. Accordingly, if the limiting aperture substrate 206 is arranged between the third stage electromagnetic lens 215 and the fourth stage electromagnetic lens 216 which take charge of reduction of multi-beams, it may happen that particles, such as dirt adhering to the limiting aperture substrate 206, easily adhere to the surface of the target object. Then, according to the first embodiment, the limiting aperture substrate 206 which blocks beams deflected by the blanking aperture array mechanism 204 is arranged between a group of the first and second stage electromagnetic lenses 213 and 214 taking charge of correcting distortion of a formed aperture image by the multi-beams 20 and a group of the third and subsequent stage electromagnetic lenses 215 and 216 mainly taking charge of reduction of multi-beams. Thus, the third and subsequent stage electromagnetic lenses 215 and 216 which take charge of reduction of multi-beams can be arranged at the downstream side of the limiting aperture substrate 206. Consequently, it becomes possible to keep the limiting aperture substrate 206 relatively away from the target object 101, thereby inhibiting adhesion of particles.

Moreover, according to the first embodiment, after the multi-beams 20 are made to cross over near the arrangement height position of the limiting aperture substrate 206, they are made to crossover near the arrangement height position of the fourth stage electromagnetic lens 216. By this, since the beam diameter of the entire multi-beams 20 passing through the fourth stage electromagnetic lens 216 can be decreased, it becomes possible for the multi-beams 20 to pass through the central part of the fourth stage electromagnetic lens 216. Therefore, the optical property of the electromagnetic lens 216 is improved, which also leads to decrease distortion of a formed aperture image by the multi-beams 20.

Figure 17:
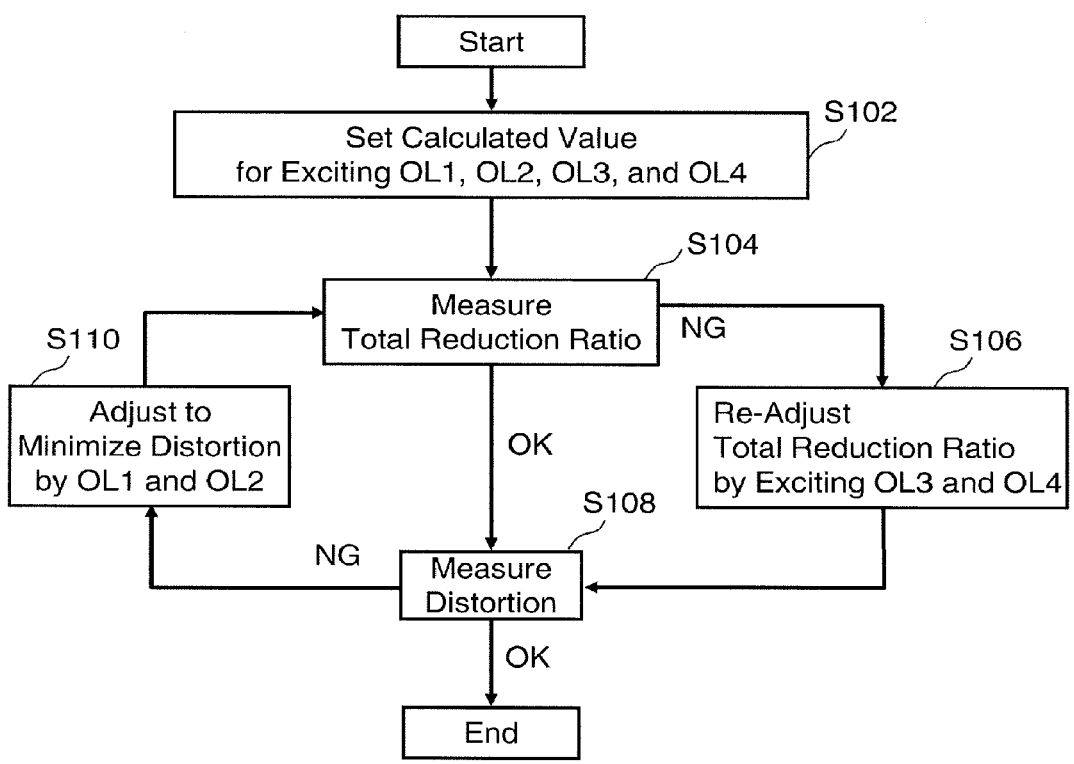
FIG. 17 is a flowchart showing main steps of a method for adjusting multi-beams according to the first embodiment.

FIG. 17 is a flowchart showing main steps of a method for adjusting multi-beams according to the first embodiment. In FIG. 17, before performing writing processing, such as the time of starting the writing measure 100, the method for adjusting multi-beams according to the first embodiment executes a series of steps of an excitation setting step (S102), a total reduction ratio measurement step (S104), a total reduction ratio adjustment step (S106), a distortion measurement step (S108), and a distortion correction step (S110).

In the excitation setting step (S102), a set value of each stage electromagnetic lens for exciting a plurality of stages of electromagnetic lenses 213, 214, 215, and 216, which form (focus) an aperture image obtained by forming the multi-beams 20, is set while the multi-beams 20 of the electron beam 200 are reduced toward the target object 101. An optimum value in design can be individually set here.

In the total reduction ratio measurement step (S104), a total reduction ratio of the multi-beams 20 is measured using a plurality of stages of electromagnetic lenses 213, 214, 215, and 216 for each of which a corresponding set value has been set. Specifically, the multi-beams 20 actually irradiate an evaluation substrate coated with resist. Then, the size of a resist pattern obtained by developing the irradiated evaluation substrate is measured. A total reduction ratio of the multi-beams 20 can be calculated by dividing the size of the entire multi-beams 20 formed by passing through a plurality of holes 22 in the shaping aperture array substrate 203 by the measured size of the resist pattern. Alternatively, it is also preferable to measure the beam shape of the entire multi-beams 20 by arranging a mark (not shown) on the XY stage 105, and scanning the mark with the multi-beams 20 in order to detect an emitted secondary electron by a detector (not shown).

Then, it is determined whether a measured total reduction ratio is equal to a desired total reduction ratio, or is within a desired range or not.

In the total reduction ratio adjustment step (S106), if the measured total reduction ratio is not within the desired range (first desired range), an adjustment is made so that the measured total reduction ratio of multi-beams may be within the desired range, by using the third and subsequent stage electromagnetic lenses 215 and 216 in plural stage electromagnetic lenses. Specifically, the lens control circuit 132 adjusts a set value for exciting the third and subsequent stage electromagnetic lenses 215 and 216. However, it is assumed that an error occurs between a designed arrangement position in the electron optical column (beam column) 102 and an actual arrangement position in the electron optical column 102, or an error occurs in the total reduction ratio by a single performance error of an electromagnetic lens itself, and the like. Accordingly, in that case, such an error should be adjusted.

In the distortion measurement step (S108), if the total reduction ratio is within a desired range, distortion of a formed aperture image by multi-beams obtained by forming the multi-beams 20 is measured. Specifically, the multi-beams 20 actually irradiate an evaluation substrate coated with resist. Then, the amount of shape distortion of a resist pattern obtained by developing the irradiated evaluation substrate is measured. Alternatively, a measurement method using beams may also be employed. Specifically, as the measurement method using beams, a beam (beam ON) to pass through the blanking aperture array mechanism 204 is selected, and beam scanning is performed on a mark (not shown) arranged on the XY stage 105 in order to detect a reflection electron or a secondary electron by a detector (not shown). Then, a beam position is measured based on an image acquired by the detection. By this method, a distortion amount of a formed aperture image by the multi-beams 20 can be measured by selecting beams (ON beams) on the surface of the shaping aperture array substrate 203 (SAA), and measuring beam positions a plurality of times.

Then, it is determined whether the measured amount of shape distortion of the resist pattern is within a desired range.

In the distortion correction step (S110), if the measured distortion amount of a formed aperture image by the multi-beams 20 is not within the desired range (second desired range), an adjustment is made so that the measured distortion amount of the formed aperture image by the multi-beams 20 may be within the desired range, by using the first and second stage electromagnetic lenses 213 and 214 in plural stage electromagnetic lenses. Specifically, the lens control circuit 132 adjusts a set value for exciting the first and second stage electromagnetic lenses 213 and 214. The multi-beams 20 actually irradiate an evaluation substrate coated with resist while varying the set value for exciting the first and second stage electromagnetic lenses 213 and 214. Then, for each set value, the amount of shape distortion of a resist pattern obtained by developing the irradiated evaluation substrate is measured. An excitation set value which makes the distortion amount minimum should be set.

As shown in FIG. 17, if the total reduction ratio is adjusted, the amount of distortion of a formed aperture image by the multi-beams 20 is re-measured at each adjustment time, and if the amount of distortion of a formed aperture image by the multi-beams 20 is adjusted, the total reduction ratio is re-measured at each adjustment time, until finally the total reduction ratio of the multi-beams 20 comes within a desired range (first desired range) and the amount of distortion of a formed aperture image by the multi-beams 20 comes within a desired range (second desired range). Thus, an excitation set value of each lens of the electromagnetic lens group 212 is adjusted as described above.

Then, using the writing apparatus 100 in which setting has been completed, patterns are written on the target object 101. First, the control computer 110 reads writing data from the storage device 140, and generates irradiation time data for each pixel 36. The irradiation time data is rearranged in the order of shot, and output to the deflection control circuit 130 in the order of shot, along with stored in the storage device 142. While performing the writing operation described above, the multi-beams 20 irradiate the target object 101 with performing blanking control of the multi-beams 20 such that each pixel 36 is irradiated with a beam during the irradiation time indicated by the irradiation time data.

As described above, according to the first embodiment, the reduction ratio of multi-beams 20 can be increased while inhibiting distortion in a formed image of an aperture image obtained by forming the multi-beams 20. Consequently, the height dimension of the writing apparatus 100 can be inhibited.

Embodiments have been explained referring to concrete examples described above. However, the present invention is not limited to these specific examples. Although the case of the total reduction ratio being 200:1 or 300:1 has been described above, it is not limited thereto. The present invention can be applied to the case of the total reduction ratio being high, such as 100:1 or more. Moreover, some or all of a plurality of stages of electromagnetic lenses 213, 214, 215, and 216 described above may be replaced with electrostatic lenses. It goes without saying that, when using an electrostatic lens, not exciting electric potential but applying electric potential is to be performed.

While the apparatus configuration, control method, and the like not directly necessary for explaining the present invention are not described, some or all of them can be selectively used case-by-case basis. For example, although description of the configuration of the control unit for controlling the writing apparatus 100 is omitted, it should be understood that some or all of the configuration of the control unit can be selected and used appropriately when necessary.

In addition, any other multi charged particle beam exposure apparatus and method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multi charged particle beam irradiation apparatus comprising:
    an emission unit configured to emit a charged particle beam;
    a shaping aperture array substrate, in which a plurality of first openings are formed as an aperture array, configured to form and shape multi-beams by making a region including a whole of the plurality of first openings irradiated by the charged particle beam, and making portions of the charged particle beam individually pass through a corresponding one of the plurality of first openings; and
    a plurality of stages of lenses, arranged such that a reduction ratio of multi-beams by at least one lens of a stage before a last stage lens of the plurality of stages of lenses is larger than a reduction ratio of the multi-beams by the last stage lens, configured to correct a distortion of a formed image in a case of forming an image of the aperture array by the multi-beams, and to form the image of the aperture array by the multi-beams at a height position between the last stage lens and a last-but-one stage lens of the plurality of stages of lenses, and at a surface of a target object.

2. The apparatus according to claim 1, wherein the plurality of stages of lenses include four or more stage lenses, configured to form the image of the aperture array by the multi-beams by correcting the distortion of the formed image in the case of forming the image of the aperture array by the multi-beams by a first stage lens and a second stage lens, and reducing the multi-beams by a third and subsequent stage lenses.

3. The apparatus according to claim 2, wherein the first stage lens and the second stage lens are excited to have reverse excitation polarities.

4. The apparatus according to claim 2 further comprising:
    a blanking aperture array mechanism, including a substrate in which a plurality of second openings are formed, and a plurality of electrodes arranged at the substrate so as to be opposite each other with respect to a corresponding one of the plurality of second openings, configured to individually perform blanking deflection for each beam of the multi-beams by using the plurality of electrodes; and
    a limiting aperture substrate, in which a third opening is formed, arranged between a group of the first stage lens and the second stage lens and a group of the third and subsequent stage lenses, configured to block a beam deflected by the blanking aperture array mechanism.

5. The apparatus according to claim 1, wherein the plurality of stages of lenses are arranged such that a reduction ratio of the multi-beams by the last-but-one stage lens is larger than the reduction ratio of the multi-beams by the last stage lens.

6. The apparatus according to claim 5, wherein the reduction ratio of the last stage lens is extraordinarily smaller than the reduction ratio of the last-but-one stage lens.

7. A multi charged particle beam irradiation method comprising:
    emitting a charged particle beam;
    forming and shaping multi-beams by making portions of the charged particle beam individually pass through a corresponding one of a plurality of openings as an aperture array in a shaping aperture array substrate; and
    correcting a distortion of a formed image in a case of forming an image of the aperture array by the multi-beams, and forming the image of the aperture array by the multi-beams at a height position between a last stage lens and a last-but-one stage lens of a plurality of stages of lenses, and at a surface of a target object, by using the plurality of stages of lenses arranged such that a reduction ratio of the multi-beams by at least one lens of a stage before the last stage lens is larger than a reduction ratio of the multi-beams by the last stage lens.

8. The method according to claim 7, wherein the plurality of stages of lenses are arranged such that a reduction ratio of the multi-beams by the last-but-one stage lens is larger than the reduction ratio of the multi-beams by the last stage lens.

9. The method according to claim 8, wherein the plurality of stages of lenses include four or more stage lenses, configured to form the image of the aperture array by the multi-beams by correcting the distortion of the formed image in the case of forming the image of the aperture array by the multi-beams by a first stage lens and a second stage lens, and reducing the multi-beams by a third and subsequent stage lenses.

10. A multi charged particle beam adjustment method comprising:
    setting a set value of each stage lens for exciting a plurality of stages of lenses which form an image of an aperture array by multi-beams formed by the aperture array while reducing the multi-beams of a charge particle beam toward a target object;
    measuring a total reduction ratio of the multi-beams by using the plurality of stages of lenses for each of which a corresponding set value has been set;
    adjusting the total reduction ratio of the multi-beams to be within a first desired range by using a third and subsequent stage lenses of the plurality of stages of lenses, in a case where the total reduction ratio is not within the first desired range;
    measuring a distortion amount of a formed image obtained by forming the image of the aperture array by the multi-beams in a case where the total reduction ratio is within the first desired range; and
    adjusting the distortion amount of the formed image in the case of forming the image of the aperture array by the multi-beams to be within a second desired range by using a first stage lens and a second stage lens of the plurality of stages of lenses, in a case where the distortion amount of the formed image obtained by forming the image of the aperture array by the multi-beams is not within the second desired range,
    wherein in a case where the total reduction ratio is adjusted, the distortion amount of the formed image obtained by forming the image of the aperture array by the multi-beams is re-measured at each time of the adjusting, and in a case where the distortion amount of the formed image obtained by forming the image of the aperture array by the multi-beams is adjusted, the total reduction ratio of the multi-beams is re-measured at each time of the adjusting, until finally the total reduction ratio of the multi-beams comes within the first desired range, and the distortion amount of the formed image obtained by forming the image of the aperture array by the multi-beams comes within the second desired range.

* * * * *